US009601557B2

United States Patent
Yang et al.

(10) Patent No.: US 9,601,557 B2
(45) Date of Patent: Mar. 21, 2017

(54) FLEXIBLE DISPLAY

(71) Applicant: Apple Inc., Cupertino, CA (US)

(72) Inventors: Byung Duk Yang, Cupertino, CA (US); John Z. Zhong, Cupertino, CA (US); Shih Chang Chang, Cupertino, CA (US); Vasudha Gupta, Cupertino, CA (US); Young Bae Park, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/837,311

(22) Filed: Mar. 15, 2013

(65) Prior Publication Data

US 2014/0138637 A1 May 22, 2014

Related U.S. Application Data

(60) Provisional application No. 61/727,473, filed on Nov. 16, 2012.

(51) Int. Cl.
*H01L 27/32* (2006.01)
*H01L 27/12* (2006.01)

(52) U.S. Cl.
CPC ........ *H01L 27/3276* (2013.01); *H01L 27/124* (2013.01); *H01L 27/1218* (2013.01);
(Continued)

(58) Field of Classification Search
CPC ......... G02F 1/136286; G02F 1/133305; H01L 27/3276; H01L 27/1218; H01L 27/1244;
(Continued)

(56) References Cited

U.S. PATENT DOCUMENTS

| 4,066,855 A | 1/1978 | Zenk |
| 4,085,302 A | 4/1978 | Zenk et al. |

(Continued)

FOREIGN PATENT DOCUMENTS

| CN | 101009332 A | 8/2007 |
| CN | 102148336 A | 8/2011 |

(Continued)

OTHER PUBLICATIONS

International Search Report and Written Opinion dated May 6, 2014, PCT/US2013/066156, 17 pages.

(Continued)

*Primary Examiner* — David Vu
*Assistant Examiner* — Mouloucoulaye Inoussa
(74) *Attorney, Agent, or Firm* — Zachary D. Hadd; Kendall W. Abbasi

(57) ABSTRACT

A flexible display having an array of pixels or sub-pixels is provided. The display includes a flexible substrate and an array of thin film transistors (TFTs) corresponding to the array of pixels or sub-pixels on the substrate. The display also includes a first plurality of metal lines coupled to gate electrodes of the TFTs and a second plurality of metal lines coupled to source electrodes and drain electrodes of the TFTs. At least one of the first plurality of metal lines and the second plurality of metal lines comprises a non-stretchable portion in the TFT areas and a stretchable portion outside the TFT areas.

36 Claims, 18 Drawing Sheets

(52) U.S. Cl.
CPC ...... *H01L 27/1244* (2013.01); *H01L 27/1248* (2013.01); *H01L 2251/5338* (2013.01)

(58) Field of Classification Search
CPC ............. H01L 27/1248; H01L 27/1266; H01L 29/78603; Y10S 438/978
USPC .......... 349/145, 158; 257/40, 622, 618, 629, 257/632, 635, 638, 647, 457; 438/978
See application file for complete search history.

(56) References Cited

U.S. PATENT DOCUMENTS

| | | | |
|---|---|---|---|
| 4,958,205 A | 9/1990 | Takeda et al. | |
| 5,075,237 A | 12/1991 | Wu | |
| 5,235,451 A | 8/1993 | Bryan | |
| 5,483,261 A | 1/1996 | Yasutake | |
| 5,488,204 A | 1/1996 | Mead et al. | |
| 5,592,199 A | 1/1997 | Kawaguchi et al. | |
| 5,717,556 A | 2/1998 | Yanagida | |
| 5,825,352 A | 10/1998 | Bisset et al. | |
| 5,835,079 A | 11/1998 | Shieh | |
| 5,880,411 A | 3/1999 | Gillespie et al. | |
| 5,990,492 A | 11/1999 | Kim et al. | |
| 6,037,017 A | 3/2000 | Kashiro | |
| 6,104,464 A | 8/2000 | Adachi et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,372,636 B1 | 4/2002 | Chooi et al. | |
| 6,500,701 B2 | 12/2002 | Higashi et al. | |
| 6,690,387 B2 | 2/2004 | Zimmerman et al. | |
| 6,803,245 B2 | 10/2004 | Auch et al. | |
| 6,869,825 B2 | 3/2005 | Chiu | |
| 6,882,398 B2 | 4/2005 | Watanabe et al. | |
| 6,956,633 B2 | 10/2005 | Okada et al. | |
| 6,970,219 B1 | 11/2005 | Hermann | |
| 7,015,894 B2 | 3/2006 | Morohoshi | |
| 7,034,913 B2 | 4/2006 | Ishida | |
| 7,184,064 B2 | 2/2007 | Zimmerman et al. | |
| 7,221,012 B2 | 5/2007 | Chu et al. | |
| 7,258,549 B2 | 8/2007 | Asahi et al. | |
| 7,453,542 B2 | 11/2008 | Muramatsu et al. | |
| 7,465,678 B2 | 12/2008 | Bhattacharya | |
| 7,476,896 B2 | 1/2009 | Choi et al. | |
| 7,495,736 B2 | 2/2009 | Chen et al. | |
| 7,541,671 B2 | 6/2009 | Foust et al. | |
| 7,593,086 B2 | 9/2009 | Jeong et al. | |
| 7,593,087 B2 | 9/2009 | Jang | |
| 7,663,607 B2 | 2/2010 | Hotelling et al. | |
| 7,767,502 B2 | 8/2010 | Kim et al. | |
| 7,787,917 B2 | 8/2010 | Aoki et al. | |
| 7,834,451 B2 | 11/2010 | Lee et al. | |
| 7,843,041 B2 | 11/2010 | Kodaira et al. | |
| 7,936,405 B2 | 5/2011 | Kitagawa | |
| 8,003,986 B2 | 8/2011 | Teng et al. | |
| 8,039,838 B2 | 10/2011 | Heitzinger et al. | |
| 8,106,309 B2 | 1/2012 | Hwang et al. | |
| 8,113,902 B2 | 2/2012 | Kang et al. | |
| 8,134,675 B2 | 3/2012 | Kawaguchi et al. | |
| 8,194,048 B2 | 6/2012 | Oowaki | |
| 8,203,261 B2 | 6/2012 | Tanaka et al. | |
| 8,319,725 B2 | 11/2012 | Okamoto et al. | |
| 8,373,181 B2 | 2/2013 | Aurongzeb et al. | |
| 8,434,909 B2 | 5/2013 | Nichol et al. | |
| 8,471,995 B2 | 6/2013 | Tseng et al. | |
| 8,716,932 B2 | 5/2014 | Rappoport et al. | |
| 8,723,824 B2 | 5/2014 | Myers et al. | |
| 8,724,304 B2 | 5/2014 | Raff et al. | |
| 8,787,016 B2 | 7/2014 | Rothkopf et al. | |
| 8,804,347 B2 | 8/2014 | Martisauskas et al. | |
| 8,816,977 B2 | 8/2014 | Rothkopf et al. | |
| 8,929,085 B2 | 1/2015 | Franklin et al. | |
| 8,934,228 B2 | 1/2015 | Franklin et al. | |
| 8,947,627 B2 | 2/2015 | Rappoport et al. | |
| 9,098,242 B2 | 8/2015 | Rappoport et al. | |
| 9,110,320 B2 | 8/2015 | Chen et al. | |
| 2001/0035572 A1 | 11/2001 | Isaak | |
| 2002/0047978 A1 | 4/2002 | Fukuta et al. | |
| 2003/0173663 A1 | 9/2003 | Kami et al. | |
| 2004/0063001 A1 | 4/2004 | Wu et al. | |
| 2004/0113250 A1 | 6/2004 | Khandros et al. | |
| 2004/0119787 A1 | 6/2004 | Mori | |
| 2004/0161010 A1* | 8/2004 | Matsumura ............... H01S 5/22 372/46.01 | |
| 2005/0012199 A1 | 1/2005 | Rosenau | |
| 2005/0140273 A1* | 6/2005 | Guo et al. .................... 313/504 | |
| 2005/0285990 A1 | 12/2005 | Havelka et al. | |
| 2006/0026521 A1 | 2/2006 | Hotelling et al. | |
| 2006/0043318 A1 | 3/2006 | Kodera | |
| 2006/0061241 A1 | 3/2006 | Sasaki | |
| 2006/0192277 A1 | 8/2006 | RaghuRam | |
| 2006/0197753 A1 | 9/2006 | Hotelling | |
| 2006/0283212 A1 | 12/2006 | Wilson | |
| 2007/0001282 A1 | 1/2007 | Kang et al. | |
| 2007/0080433 A1* | 4/2007 | Lai ........................ G02F 1/1345 257/666 | |
| 2007/0090420 A1 | 4/2007 | Chu et al. | |
| 2007/0090506 A1 | 4/2007 | Sundstrom | |
| 2007/0148831 A1 | 6/2007 | Nagata et al. | |
| 2007/0173031 A1* | 7/2007 | Kodaira ............... H01L 27/1266 438/400 | |
| 2008/0117376 A1 | 5/2008 | Takenaka | |
| 2008/0129761 A1* | 6/2008 | Kim ..................... G09G 3/2096 345/690 | |
| 2008/0158498 A1* | 7/2008 | Chang et al. ................ 349/158 | |
| 2008/0185705 A1 | 8/2008 | Osborn et al. | |
| 2008/0241549 A1 | 10/2008 | Seon et al. | |
| 2008/0248191 A1 | 10/2008 | Daniels | |
| 2009/0001380 A1* | 1/2009 | Yang et al. ..................... 257/72 | |
| 2009/0027896 A1 | 1/2009 | Nishimura et al. | |
| 2009/0051640 A1* | 2/2009 | Tanaka ............. G02F 1/136286 345/92 | |
| 2009/0148678 A1 | 6/2009 | Hwang | |
| 2009/0167171 A1 | 7/2009 | Jung et al. | |
| 2009/0201635 A1 | 8/2009 | Kim et al. | |
| 2009/0256471 A1 | 10/2009 | Kim et al. | |
| 2009/0284688 A1 | 11/2009 | Shiraishi et al. | |
| 2010/0007817 A1 | 1/2010 | Kim | |
| 2010/0026952 A1 | 2/2010 | Miura et al. | |
| 2010/0044685 A1* | 2/2010 | Kim ..................... H01L 27/3272 257/40 | |
| 2010/0225624 A1 | 9/2010 | Fu et al. | |
| 2010/0226103 A1 | 9/2010 | Muro et al. | |
| 2010/0315399 A1 | 12/2010 | Jacobson et al. | |
| 2011/0006301 A1 | 1/2011 | Yamazaki et al. | |
| 2011/0007042 A1 | 1/2011 | Miyaguchi | |
| 2011/0086680 A1 | 4/2011 | Kim et al. | |
| 2011/0132643 A1 | 6/2011 | Hattori et al. | |
| 2011/0227064 A1 | 9/2011 | Park et al. | |
| 2011/0227086 A1* | 9/2011 | French ................ H01L 27/1248 257/59 | |
| 2011/0227846 A1 | 9/2011 | Imazeki | |
| 2011/0250435 A1 | 10/2011 | Ge et al. | |
| 2011/0261040 A1* | 10/2011 | Han ..................... G06F 3/0418 345/207 | |
| 2011/0272181 A1 | 11/2011 | Koo et al. | |
| 2012/0056173 A1 | 3/2012 | Pieralisi | |
| 2012/0062447 A1* | 3/2012 | Tseng et al. ..................... 345/33 | |
| 2012/0127087 A1 | 5/2012 | Ma | |
| 2012/0146886 A1 | 6/2012 | Minami et al. | |
| 2012/0175607 A1 | 7/2012 | Shu et al. | |
| 2012/0186859 A1 | 7/2012 | Yamashita | |
| 2012/0218219 A1 | 8/2012 | Rappoport et al. | |
| 2012/0242588 A1 | 9/2012 | Myers et al. | |
| 2012/0243151 A1 | 9/2012 | Lynch | |
| 2012/0248451 A1 | 10/2012 | Sone et al. | |
| 2012/0307423 A1 | 12/2012 | Bohn et al. | |
| 2013/0020731 A1 | 1/2013 | Kim et al. | |
| 2013/0021289 A1 | 1/2013 | Chen et al. | |
| 2013/0069061 A1 | 3/2013 | Nakazawa | |
| 2013/0076601 A1 | 3/2013 | Wang et al. | |
| 2013/0081756 A1 | 4/2013 | Franklin et al. | |
| 2013/0082984 A1 | 4/2013 | Drzaic et al. | |

(56) References Cited

U.S. PATENT DOCUMENTS

| | | | |
|---|---|---|---|
| 2013/0088671 A1 | 4/2013 | Drzaic et al. |
| 2013/0140965 A1 | 6/2013 | Franklin et al. |
| 2013/0161622 A1 | 6/2013 | Lee |
| 2013/0333919 A1 | 12/2013 | Nguyen et al. |
| 2013/0342099 A1 | 12/2013 | Weber et al. |
| 2014/0042406 A1 | 2/2014 | Degner et al. |
| 2014/0042427 A1 | 2/2014 | Hung et al. |
| 2014/0049500 A1 | 2/2014 | Chen et al. |
| 2014/0055702 A1 | 2/2014 | Park et al. |
| 2014/0092338 A1 | 4/2014 | Miyazaki et al. |
| 2014/0197531 A1 | 7/2014 | Bolognia |
| 2014/0217373 A1 | 8/2014 | Youn et al. |
| 2014/0232956 A1 | 8/2014 | Kwon et al. |
| 2016/0085125 A1 | 3/2016 | Park et al. |
| 2016/0103534 A1 | 4/2016 | Zhang et al. |

FOREIGN PATENT DOCUMENTS

| | | |
|---|---|---|
| EP | 1801647 | 6/2007 |
| EP | 2187443 | 5/2010 |
| EP | 2341759 | 7/2011 |
| JP | 9321083 | 12/1997 |
| JP | 2000163031 | 6/2000 |
| JP | 2001-102595 | 4/2001 |
| JP | 2002342033 | 11/2002 |
| JP | 2003-057661 | 2/2003 |
| JP | 2003255381 A | 9/2003 |
| JP | 2004119871 | 4/2004 |
| JP | 2005-079472 | 3/2005 |
| JP | 2005303220 | 10/2005 |
| JP | 2007-227875 | 9/2007 |
| JP | 2009-048007 | 3/2009 |
| JP | 2009094099 | 4/2009 |
| JP | 2010060866 | 3/2010 |
| JP | 2012128006 | 7/2012 |
| KR | 20090093859 | 9/2009 |
| KR | 100961268 | 6/2010 |
| TW | 200712705 | 5/2007 |
| TW | 200705001 | 2/2010 |
| TW | 201230343 | 7/2012 |
| WO | 9604682 | 2/1996 |
| WO | 0169577 | 9/2001 |
| WO | 2008001051 | 1/2008 |
| WO | 2011049182 | 4/2011 |
| WO | WO 2011/071198 | 6/2011 |
| WO | WO 2011/151970 | 12/2011 |
| WO | 2012078040 | 6/2012 |

OTHER PUBLICATIONS

Invitation to Pay Additional Fees dated Feb. 10, 2014, PCT/US2013/066156, 7 pages.
Kim et al., "Optimized Structural Designs for Stretchable Silicon Integrated Circuits" Small Journal, vol. 5, Issue No. 24, 2009, p. 2841-2847, Retrieved from the internet on Aug. 4, 2015 <http://rogers.matse.illinois.edu/files%5C2009%5Coptimizedsmall.pdf>. DOI: 10.1002/smll.200900853.
Lu et al., "Metal films on polymer substrates stretched beyond 50%" Applied Physics Letters, vol. 91, Issue No. 22-909, 2007, American Institute of Physics, Retrieved from the internet on Aug. 4, 2015 <http:www.seas.harvard.edu/suo/papers/201.pdf>. DOI: 10.1063/1.2817234.
Lu et al., "The effect of film thickness on the failure strain of polymer-supported metal films" School of Engineering and Applied Sciences, vol. 58, Issue No. 5, Mar. 2010, pp. 1679-1687, Acta Materialia Inc. Published by Elsevier Ltd., Retrieved from the internet on Aug. 5, 2015 <http://www.seas.harvard.edu/suo/papers/223.pdf>. DOI: 10.10161j.actamat.2009. 11.010
Verplancke et al., "Thin-film stretchable electronics technology based on meandering interconnections: fabrication and mechanical performance" Journal of Micromechanics and Microengineering, vol. 22, Issue No. 015002, Dec. 8, 2011, IOP Publishing Ltd, Retrieved from the internet on Aug. 4, 2015 <www.researchgate.net/publication/231065132_Thin_film_stretchable_electronics_technology_based_on_meandering_interconnections_fabrication_and_mechanical_performance>. DOI:10.1088/0960-1317/22/1/015002.
Kim et al., "Stretchable Electronics: Materials Strategies and Devices" Advanced Materials, vol. 20, 2008, pp. 4887-4892, Retrieved from the internet on Aug. 4, 2015 <http://rogers.matse.illinois.edu/files/2008/advmatstrnews.pdf>. DOI: 10.1002/adma.200801788.
Vanfleteren et al., "Printed circuit board technology inspired stretchable circuits" MRS Bulletin, vol. 37, Mar. 2012, pp. 254-259, Materials Research Society, Retrieved from the internet on Aug. 4, 2015, <http://www.researchgate.net/publication/237079563_Printed_circuit_board_technology_inspired_stretchable_circuits>. DOI: 10.1557/mrs.2012.48.
Westerman, W. (Spring 1999). "Hand tracking, finger identification, and chordic manipulation on a multi-touch surface," A dissertation submitted to the faculty of the University of Delaware in partial fulfillment of the requirments for the Degree of Doctor of Philosophy in Electrical Engineering, 364 pages.
Rubine, D.H., (Dec. 1991). "The automatic recognition of gestures," CMU-CS-91-202, Submitted in partial fulfillment of the requirements for the degree of doctor of philosophy in computer science at Carnegie [Mellon University, 285 pages.
Rubine, D.H. (May 1992). "Combining gestures and direct manipulation," CHI 92, pp. 659-660.
Westermand, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.
Lee, S.K. et al., (Apr. 1985). "A multi-touch three dimensional touch-sensitive tablet," Proceedings of CHI: ACM Conference on Human Factors in Computing Systems, pp. 21-25.

\* cited by examiner

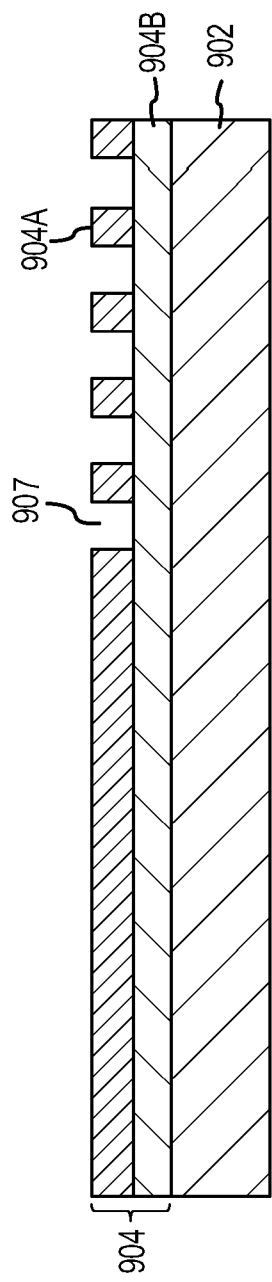
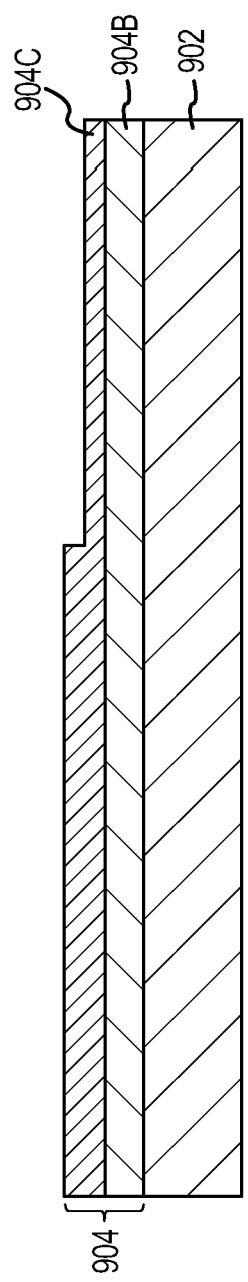
FIG.10
FIG.11

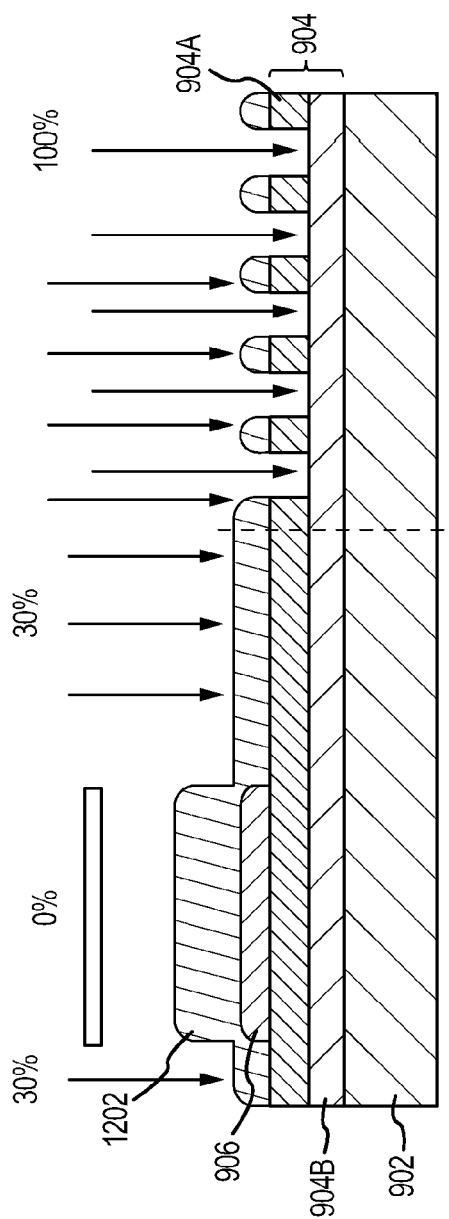
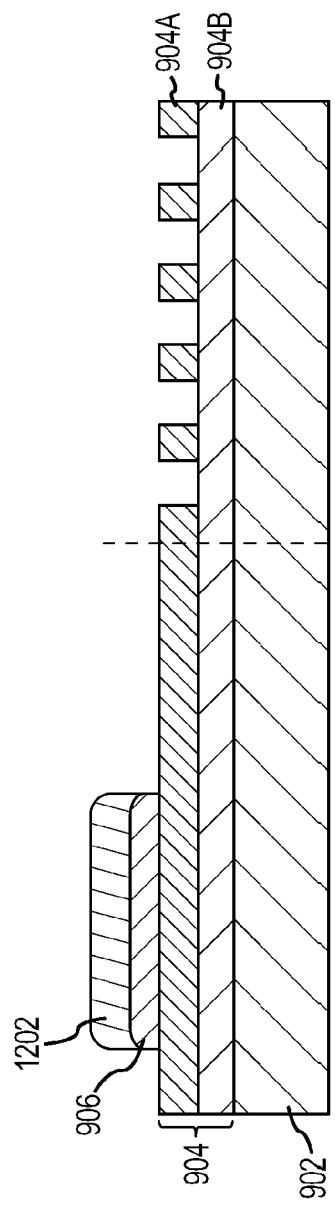

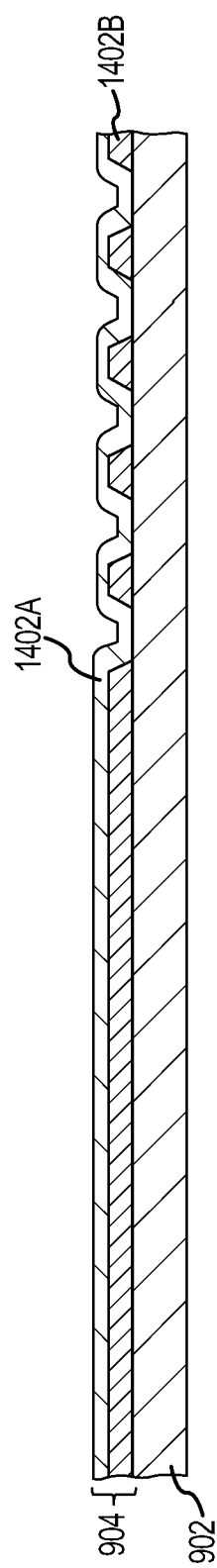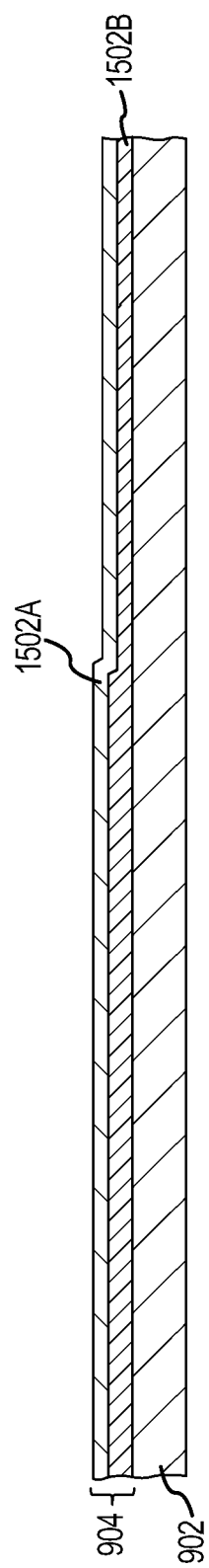

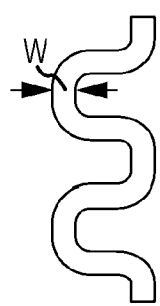
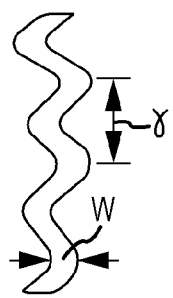
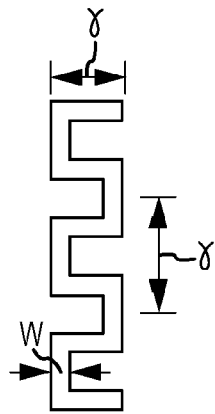
FIG.19A  FIG.19B  FIG.19C
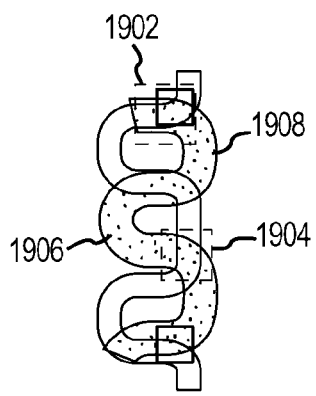
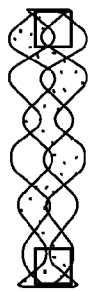
FIG.19D  FIG.19E  FIG.19F

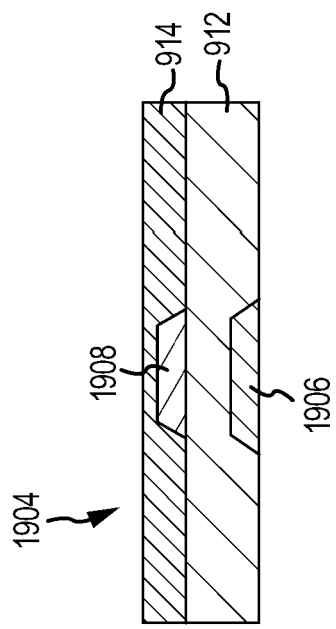
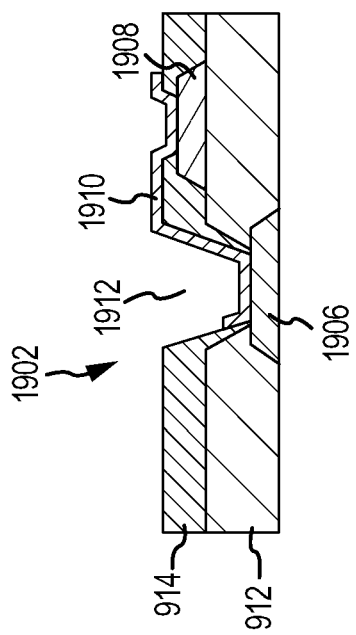

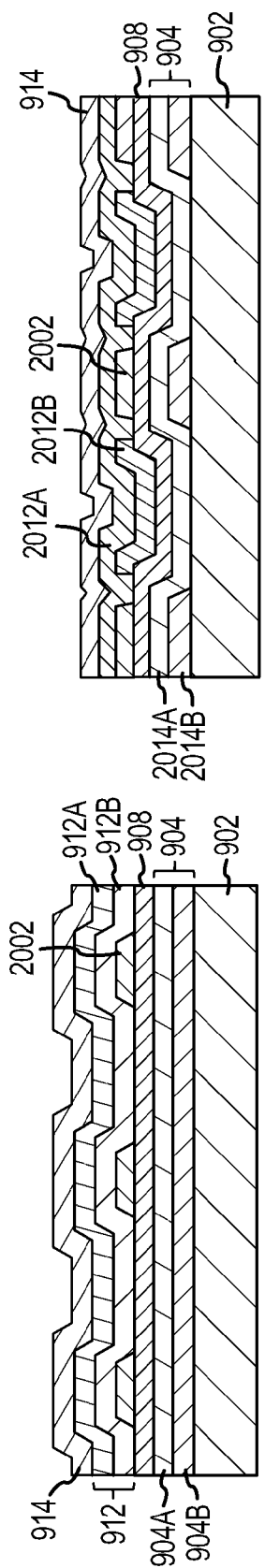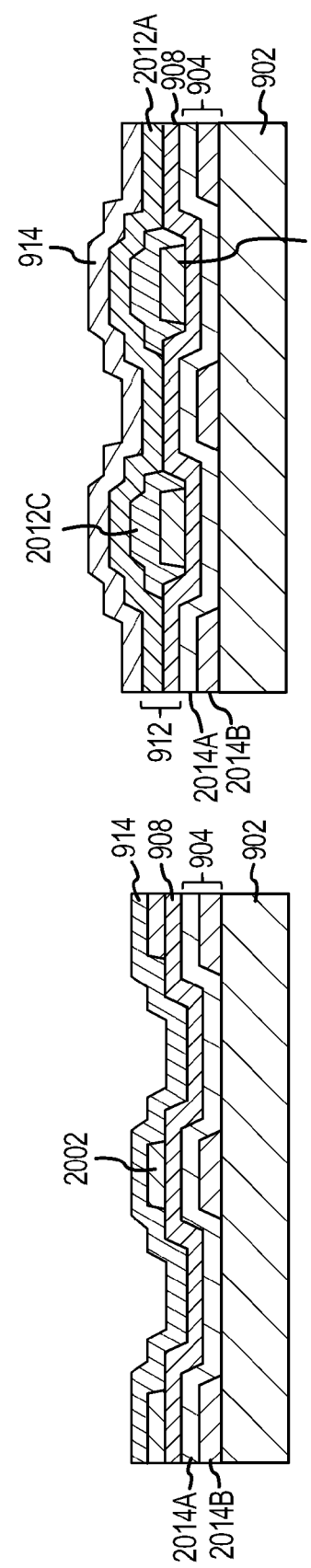

FLEXIBLE DISPLAY

CROSS-REFERENCE TO RELATED APPLICATION

The present application claims priority to U.S. Provisional Patent Application No. 61/727,473, entitled "Flexible Display", filed on Nov. 16, 2012, which is incorporated herein by reference in its entirety.

TECHNICAL FIELD

Embodiments described herein generally relate to flexible displays for computing devices, and more particularly to implementing a flexible display with metal traces that may bend as the display flexes, without breaking or cracking.

BACKGROUND

To fabricate a flexible display, many display components have been developed to use organic materials, such as organic light emitting layers, organic passivation layers and polymer substrates as flexible substrates. However, it is difficult to replace metal traces of the display with an organic material, because electrical conductivity of the organic material is not as high as the metal traces. The metal traces may be broken or disconnected when a display panel is bent, because the metal traces have a fracture strain limit of about 1%. Some other components still use silicon nitride, which may also be susceptible to cracking. Therefore, it is desirable to have display components to be bendable or flexible.

BRIEF SUMMARY

Generally, embodiments described herein relate to a display for an electronic device. The display may be an organic light emitting diode (OLED) display. The display includes a flexible substrate that supports an array of pixels or sub-pixels and thin film transistors that drive each pixel or sub-pixel. The display may be flexible about one or more axes. For example, the display may be rolled to form a cylinder or bent into a non-planar shape. By providing such flexibility, portability and certain operations of the display may be enhanced.

In one embodiment, a flexible display having an array of pixels or sub-pixels is provided. The display includes a flexible substrate and an array of thin film transistors (TFTs) corresponding to the array of pixels or sub-pixels on the substrate. The display also includes a first plurality of metal lines coupled to gate electrodes of the TFTs and a second plurality of metal lines coupled to source electrodes and drain electrodes of the TFTs. At least one of the first plurality of metal lines and the second plurality of metal lines comprises a non-stretchable portion in the TFT areas and a stretchable portion outside the TFT areas.

In another embodiment, a flexible display having an array of pixels or sub-pixels is provided. The display includes a flexible substrate and a buffer layer over the flexible substrate. The display also includes an array of thin film transistors (TFTs) corresponding to the array of pixels or sub-pixels on the substrate. The display further includes a first plurality of metal lines coupled to gate electrodes of the TFTs, and a second plurality of metal lines coupled to source electrodes and drain electrodes of the TFTs. The display also includes an integration circuit (IC) board outside the TFT and pixels, and a plurality of metal traces coupled between the TFTs and the IC board. The plurality of metal traces is formed of at least one of the first metal for gate electrode of the TFT and the second metal for source electrode and drain electrode of the TFT. The plurality of metal traces being disposed over the buffer layer. The buffer layer outside the TFT area is configured to have a striation pattern.

Additional embodiments and features are set forth in part in the description that follows, and in part will become apparent to those skilled in the art upon examination of the specification or may be learned by the practice of the embodiments discussed herein. A further understanding of the nature and advantages of certain embodiments may be realized by reference to the remaining portions of the specification and the drawings, which forms a part of this disclosure.

BRIEF DESCRIPTION OF THE DRAWINGS

FIG. 10 shows a simplified view of the buffer layer of FIG. 9.

FIG. 11 shows a simplified view of an alternative embodiment of the buffer layer of FIG. 9.

FIGS. 12 and 13 depict one sample masking and ashing operation that may generate the buffer layer shown in FIG. 10.

FIG. 14 shows an alternative embodiment of a buffer layer with striations formed in the silicon nitride of the buffer layer at the expected crack intervals.

FIG. 15 depicts an alternative embodiment of a buffer layer in which the silicon nitride has been thinned to form an area that may bend or flex without cracking.

FIG. 19A illustrates a sample serpentine pattern for a stretchable metal trace in a first embodiment.

FIG. 19B illustrates a sample sine wave pattern for a stretchable metal trace in a second embodiment.

FIG. 19C illustrates a sample sine wave shaped pattern for a stretchable metal trace in a third embodiment.

FIG. 19D illustrates a pair of serpentine patterns for a stretchable metal trace in a fourth embodiment.

FIG. 19E illustrates a pair of sine wave shaped patterns for a stretchable metal trace in a fifth embodiment.

FIG. 19F illustrates a pair of square wave shaped patterns for a stretchable metal trace in a sixth embodiment.

FIG. 19G illustrates the cross-sectional view of the first overlapping region between two metal traces of FIG. 19D in accordance with embodiment of the present disclosure.

FIG. 19H illustrates the cross-sectional view of the second overlapping region between two metal traces of FIG. 19D in accordance with embodiment of the present disclosure.

FIG. 21A illustrates a cross-sectional view of FIG. 20B in accordance with embodiments of the present disclosure.

FIG. 21B illustrates a cross-sectional view of FIG. 20C in accordance with embodiments of the present disclosure.

FIG. 21C illustrates a cross-sectional view of FIGS. 20C and 20D in accordance with embodiments of the present disclosure.

FIG. 21D illustrates a cross-sectional view of FIGS. 20C and 20D in accordance with embodiments of the present disclosure.

DETAILED DESCRIPTION

Figure 1:
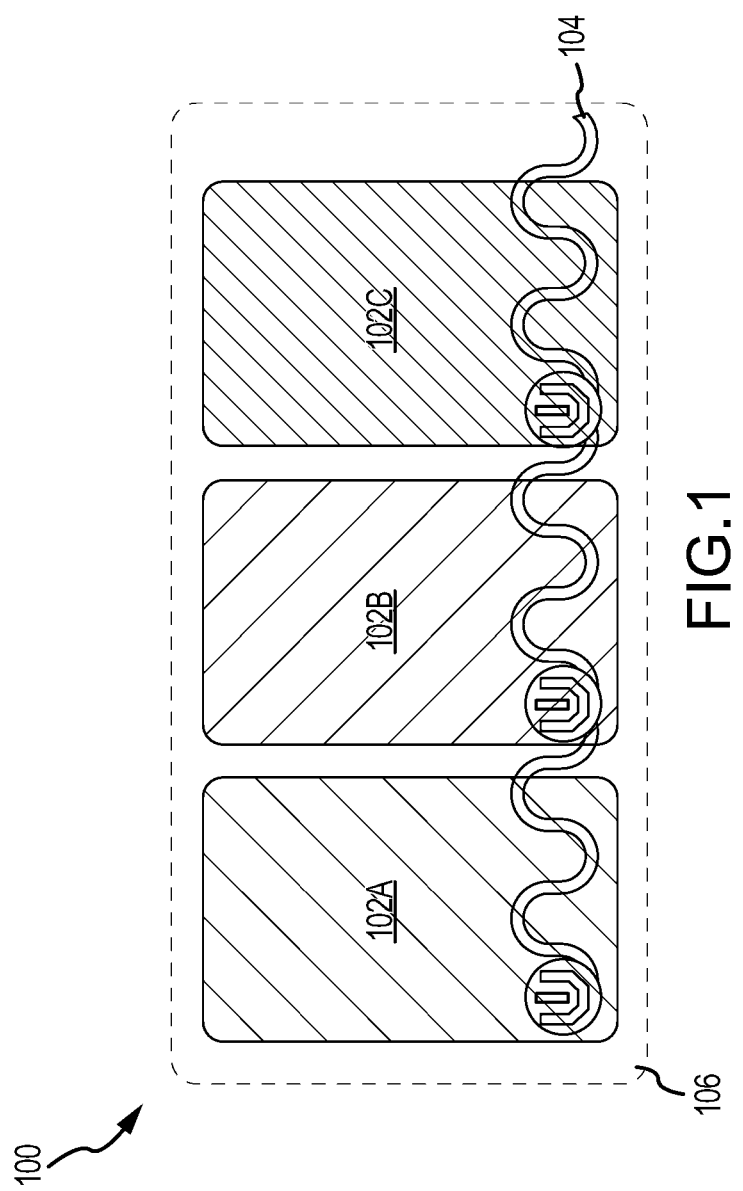
FIG. 1 depicts a single pixel of a sample display.

Generally, embodiments described herein relate to a display for an electronic device. The display may be an organic light emitting diode (OLED) display. The display includes a flexible substrate that supports an array of pixels or subpixels and thin film transistors (TFTs) that drive each pixel or sub-pixel. The display may be flexible about one or more axes. For example, the display may be rolled to form a cylinder or bent into a non-planar shape. By providing such flexibility, portability and certain operations of the display may be enhanced.

The display may be flexible outside the TFTs. For example, the display may include stretchable gate lines and/or stretchable data lines in areas outside the TFTs. The display may also include a buffer layer between the flexible substrate and the TFTs and pixels or sub-pixels. The buffer layer may be configured to be resistant to cracking. The display may also include an interlayer dielectric (ILD) between a first metal layer for gate electrodes and a second metal layer for source/drain electrodes of the TFTs. The ILD may also be configured to be resistant to cracking. Both the buffer and the ILD layers may include a sublayer of silicon oxide and a sublayer of silicon nitride. As the silicon nitride may be more susceptible to cracking when bent, one embodiment may include striations in silicon nitride.

The display may also include a flexible area near its border. Generally, the display includes an integrated circuit (IC) area outside the pixel regions or active area. There may be many metal traces coupled between the IC and the TFTs. These metal traces may be formed of either the gate metal layer or the source/drain metal layer, i.e. a first metal layer or a second metal layer. These metal traces may be configured to be stretchable. The metal traces are formed supported by a flexible substrate with a buffer layer between the metal traces and the flexible substrate. The buffer layer may be striated patterned to be resistant to cracking.

The display may include a number of individual pixels, each of which may be formed from a set of subpixels. For example, FIG. 1 displays a single pixel of a display. The pixel includes three subpixels, namely a red, green and blue subpixel.

The pixels and their subpixels may be formed from an organic light-emitting diode (OLED) material, in some embodiments. In others, different flexible materials may be used to form the pixels and subpixels.

Broadly, a sample flexible display may be constructed from a polymer substrate, an organic light-emitting layer (e.g., an OLED layer) upon the substrate, and an organic passivation layer encapsulating or overlying the light-emitting layer. The substrate may be formed from any suitable material; a polymer is but one example. As a more specific example, the substrate may be formed from polyimide. It should be appreciated that additional layers may be present in a sample flexible display. Likewise, the layers discussed herein may themselves be made up of multiple layers. A sample partial cross-section of an example flexible display is discussed in more detail below, with respect to FIG. 9.

Generally, and as shown in FIG. 1, a flexible display 100 includes flexible substrate 106 that supports subpixels 102A-C. A metal line 104 may connect the various subpixels 102A-C and also the pixels. Such lines may be, for example, gate and/or data lines as known to those skilled in the art. These are but two examples; the metal signal lines may carry other information and/or signals.

Figure 2:
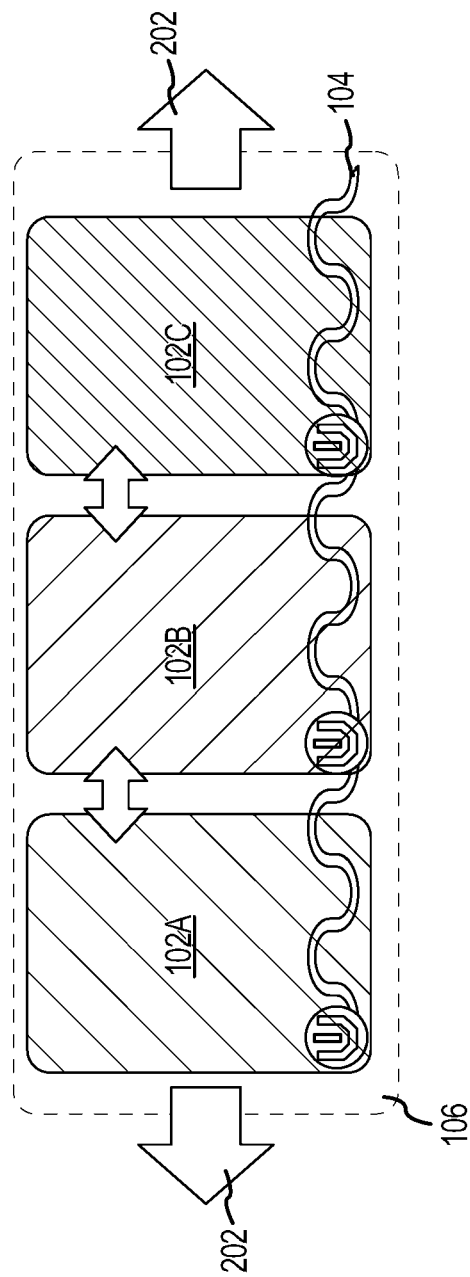
FIG. 2 shows one example of a flexible display exerting a stretching stress on a metal line.

Conventional metal signal lines or traces are straight, and may be subject to cracking or breaking when the flexible display is bent. That is, the bending motion may strain the metal lines, which may result in cracking or breaking. Accordingly, certain embodiments disclosed herein employ serpentine metal traces, as shown in FIG. 1. These serpentine traces may have several properties making them suitable for use with flexible displays. For example, when the flexible display is bent, rolled or otherwise deformed, the serpentine metal lines may stretch along their circular portions, rather than break. An example of a flexible display exerting a stretching stress on a metal line is shown in FIG. 2. As shown in the figure, the metal line 104 may stretch in the direction as pointed by arrows 202 and/or distort in response to the stress exerted by bending the display. Again, it should be appreciated that what is shown in FIG. 2 is a single pixel of a larger display.

Generally, the serpentine metal line shown in FIGS. 1 and 2 is formed from a repeating pattern of joined semicircles. The upper and lower edges of the serpentine metal trace generally are the portions that stretch or deform in response to a bending motion of the display. That is, the serpentine metal line, when stretched, bent or the like, extends such that the semicircular portions become longer and somewhat partially ellipse-shaped. This can be seen by comparing the metal line of FIG. 2 to that of FIG. 1.

The metal trace shown in FIGS. 1 and 2 typically experiences a greater strain on the interior portion of each semicircular segment that on the outer portions of such segments and/or the connecting portions between semicircular segments.

It should be appreciated that different designs and/or shapes for the metal lines may be used in alternative embodiments. Likewise, the metal lines may be formed from a variety of materials. As one example, the lines may be formed from gold. Still other sample materials include copper, silver, and other conductive metals. The metal line may or may not be formed from a relatively ductile metal. In embodiments having serpentine metal traces formed from gold, the maximum strain exerted on the trace may be approximately 0.5%, which is lower than the strain fracture limit of gold (e.g., 1%).

The subpixels 102A-102C may be formed as OLEDs subpixels. An OLED subpixel generally includes an anode, one or more organic layers, and a cathode. The corresponding OLED can either be a bottom emission type or a top emission type. In a bottom emission OLED, light is extracted from an anode side. In contrast, in a top emission OLED, light is extracted from a cathode side. The cathode is optically transparent, while the anode is reflective. This top emission OLED normally enables a larger OLED aperture than a bottom emission OLED.

It should be mentioned here that the serpentine metal lines 104 overlap with the pixel area of a top emission OLED as shown in FIGS. 1 and 2. The serpentine metal lines generally do not affect the aperture ratio for the top emission OLED device, because the metal lines are under the OLED emitting layers and thus do not block light emission. However, for a bottom emission OLED, the serpentine metal lines do not overlap with the pixel area (not shown).

It will be appreciated by those skilled in that art that a flexible display may include mesh type serpentine metal traces or other mesh type metal traces. Active components may overlap with the mesh of the serpentine metal traces, for a top emission OLED display.

Figure 3:
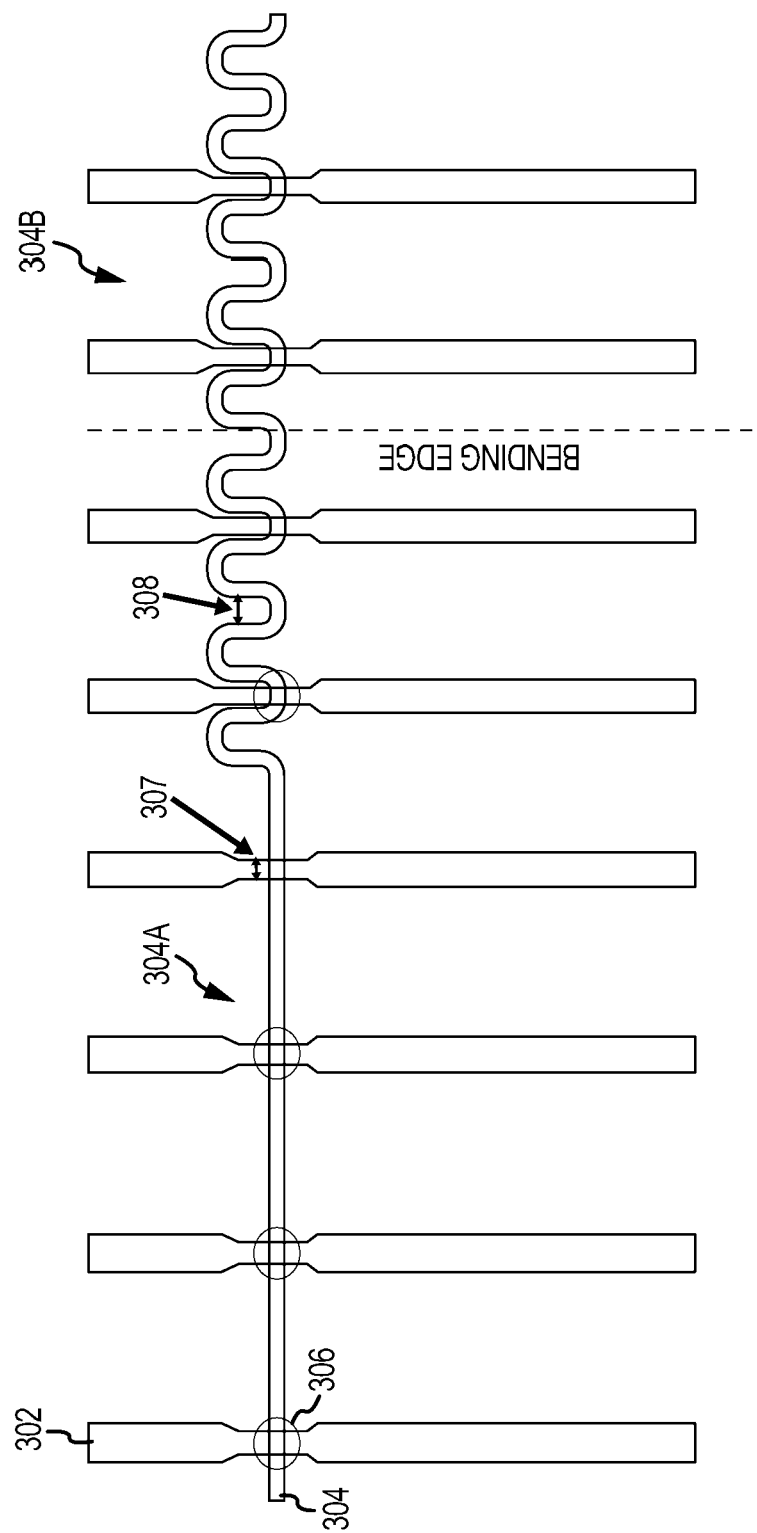
FIG. 3 generally depicts a data line overlapping a series of gate lines.

FIG. 3 generally depicts a gate line overlapping a series of data lines 302. As shown, the gate line 304 may be straight for a first portion 304A of its length and then serpentine for a second portion 304B of its length. In such an arrangement, it is contemplated that the section of the panel having the straight data line would not bend, while the section having the serpentine line would be capable of bending. It should be appreciated that some embodiments may permit bending of the display even if the gate (or other) lines are all straight. The line labeled "bending edge" illustrates one possible line along which the flexible display may bend. It should be appreciated that the location of the bending edge is arbitrary and used for illustrative purposes; the display may bend at many other points or along many other lines that are not labeled. Likewise, the display may bend along a complex curve or in multiple dimensions. Some embodiments may even permit the folding of a display.

The data line 302 may also overlap other control signal lines for the flexible display, such as an emission control line. Generally, it may be useful to have the capacitive load in overlapping area 306 of the data and gate lines to be equal in flat and bendable portions of the display. Accordingly, the gate metal space, which is indicated by dimension 308 in FIG. 3, should be wider than the minimum width of the data metal 302, indicated by dimension 307 on FIG. 3. That is, dimension 308 should be greater than dimension 307. If the two are equal, then the side wall capacitance may provide additional loading on the data and/or gate lines in the bent/flexed portion of the display. In some embodiments, the data metal lines may be thinned by approximately 0.5 micrometers on each side to create the minimum data metal width a. Such a margin may ensure that the overlap capacitance remains the same regardless of whether or not the display is bent or otherwise flexed.

Figure 4:
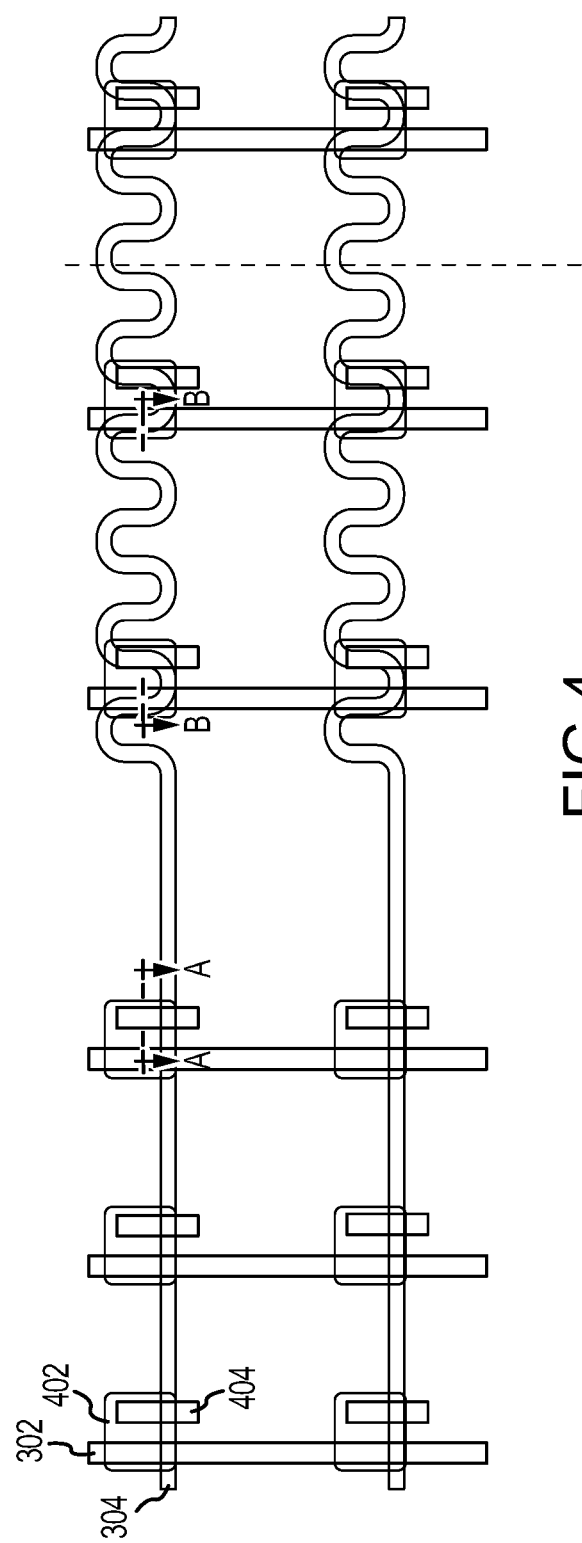
FIG. 4 shows a series of thin-film transistors (TFTs) for the display device.

FIG. 4 shows a series of thin-film transistors (TFTs) for the display device. Each TFT 402 is generally located at the intersection of a gate/control line 304 and a data line 302. Drain and source 404 is in the same metal layer as the data line 302. Generally, each TFT operates a single pixel (not shown). Generally, in the case of displays having a bendable and non-bendable area, each TFT 402 should overlap the gate/control line(s) 304 to the same extent as the other TFTs. That is, the overlap between the gate/control line(s) and a TFT in a non-bendable area (as shown on the left hand side of FIG. 4) should be the same as the overlap between the two in a bendable portion of the display (as illustrated on the right-hand side of FIG. 4). The overlap may generally be equal for all TFTs and gate/control lines regardless of whether the lines are straight, serpentine or otherwise vary. In this manner, capacitive line loading due to the TFTs may be constant, regardless of the portion of the display in question.

Figure 5:
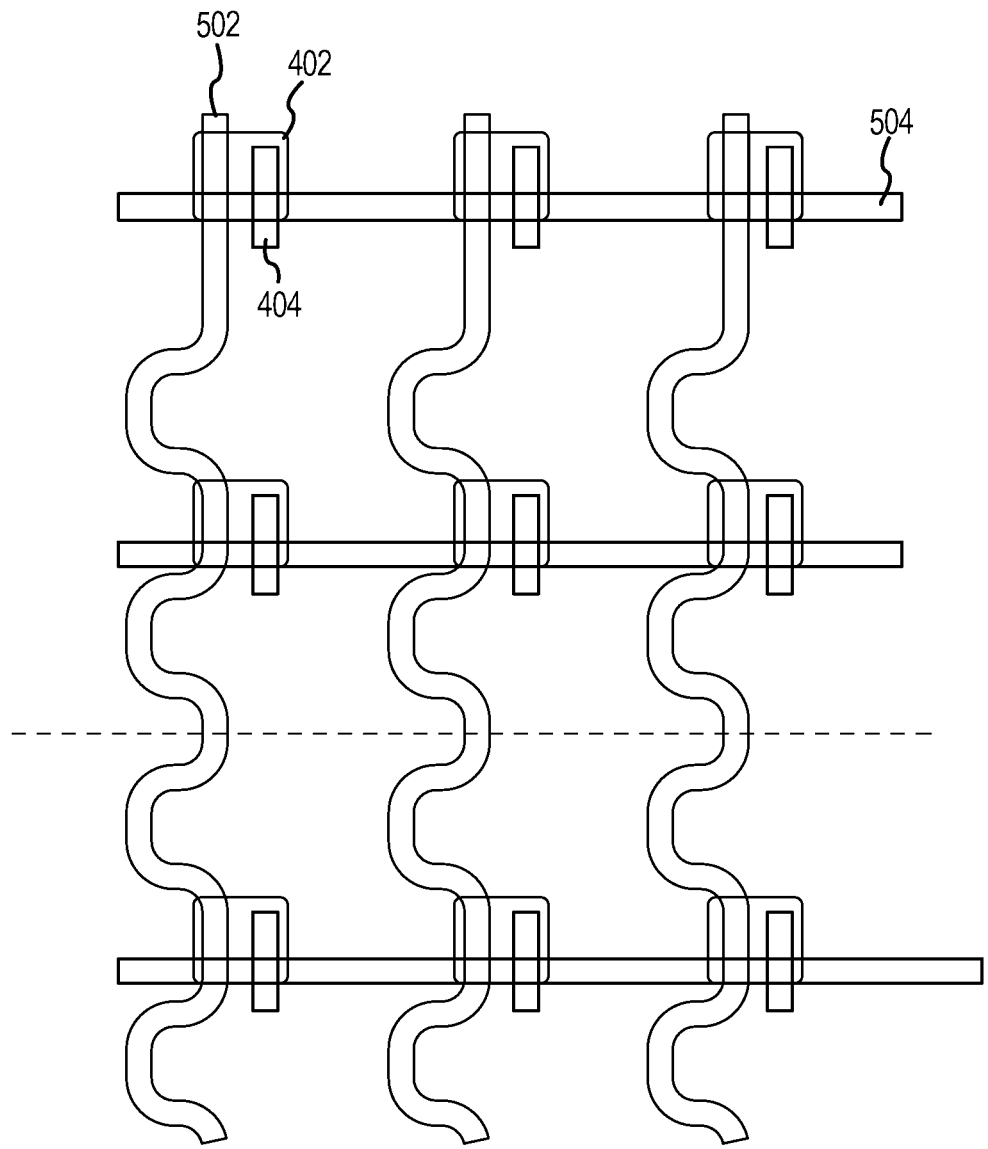
FIG. 5 illustrates a flexible display having a serpentine data line capable of accepting strain due to flexing of the display.

FIG. 5 illustrates a flexible display 500 having a serpentine data line 502 capable of accepting strain due to flexing of the display. In this flexible display, gate lines 504 may be substantially straight. The bending edge is substantially parallel to the gate lines 504. As with the embodiment of FIG. 4, capacitive line loading between the TFT and the various metal lines should be equal for TFTs located in both the flexible and non-flexible portions of the display. This may be accomplished by overlapping the TFT with a relatively straight portion of the serpentine metal line, as shown in FIG. 5. In this example, the serpentine metal data line has relatively straight edges and connectors, with rounded transitions between edge portions and connector portions. Each TFT overlies an edge portion. Because the edge portion is essentially straight, line loading for the serpentine data line of FIG. 5 is identical or near-identical to the line loading between a TFT and a straight data line. It should be appreciated that the serpentine line configuration shown in FIG. 5 (e.g., with flattened or straight edge portions, instead of semicircular edge portions) may be used with other embodiments discussed herein, such as the embodiment of FIG. 4.

Figure 6:
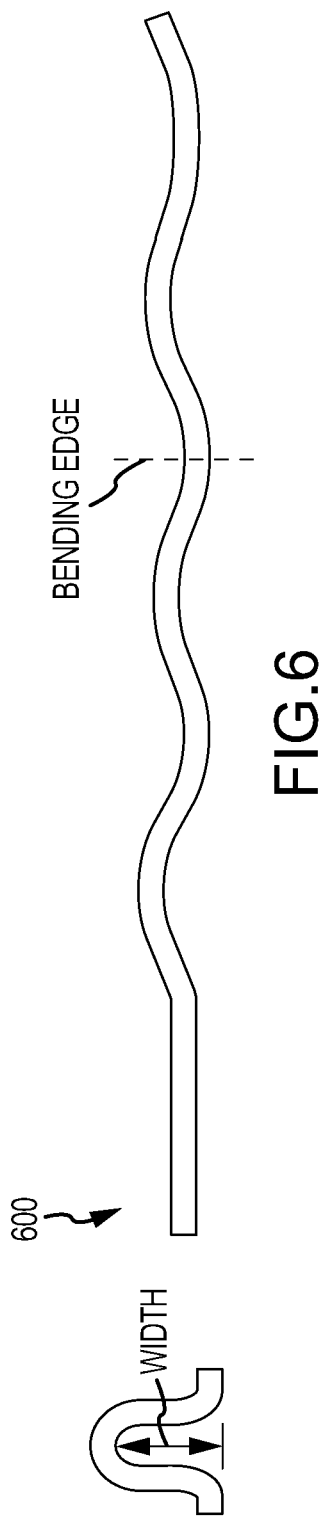
FIG. 6 depicts a metal trace resembling a sine wave along its length.

As previously mentioned, some embodiments may employ metal signal lines having a non-linear shape, but that are not serpentine. For example, FIG. 6 depicts a metal trace 600 resembling a sine wave along its length. Such a configuration may reduce the area of the display that is designated for, or dedicated to, the metal line, for example. Such configurations may be used in high density OLEDs, among other applications that either have high pixel densities and/or multiple control, data, or gate lines. The exact height and amplitude of a sine-wave shaped metal trace may vary depending on the electrical characteristics of the panel, its intended use and operating parameters, and so on. Accordingly, exact dimensions are not discussed herein as such dimensions may depend on application and could be empirically determined.

Figure 7:
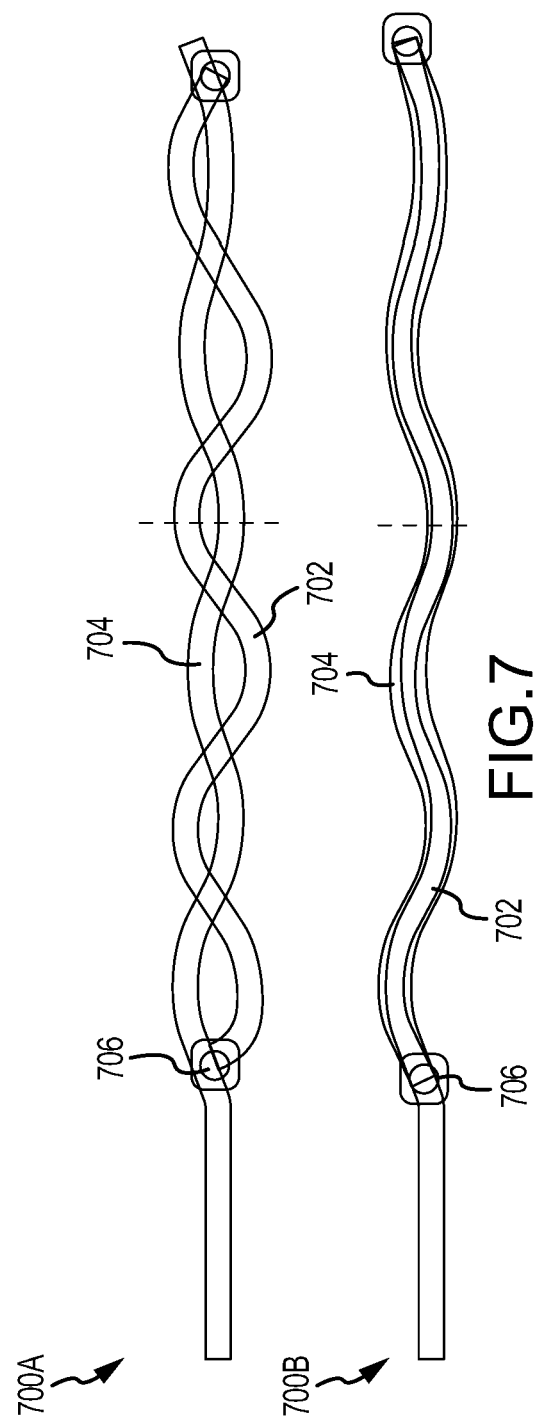
FIG. 7 illustrates two possible redundancy designs for metal traces in accordance with embodiments described herein.

As still another option, multiple metal traces may be employed instead of a single metal trace, as shown in the foregoing figures. It should be appreciated that any metal line in the flexible display may be made redundant. Further, as such a display generally has multiple layers on which metal lines may be routed, the first and second (e.g., normal and redundant) metal traces may be located in different metal layers. FIG. 7 illustrates two possible redundancy designs.

The first design 700A shown in FIG. 7, employs a pair of sine wave-shaped metal traces 702 and 704. The two metal traces overlap only at certain points 706. Essentially, the first and second metal traces are approximately 180 degrees out of phase with one another, such that the upper part of the second metal trace is linearly aligned with the lower part of the first metal trace. This can be seen along the line marked "bending edge" in first redundancy design 700A of FIG. 7. It should be appreciated that the offset between the two traces may be as large or as small as desired.

As another example, the first and second metal traces may overlap one another along all or part of their lengths, as shown in FIG. 7, and specifically in the redundancy design 700B. By overlapping the two traces 702 and 704, one may continue to operate even if the other breaks, cracks or otherwise is interrupted.

Figure 8:
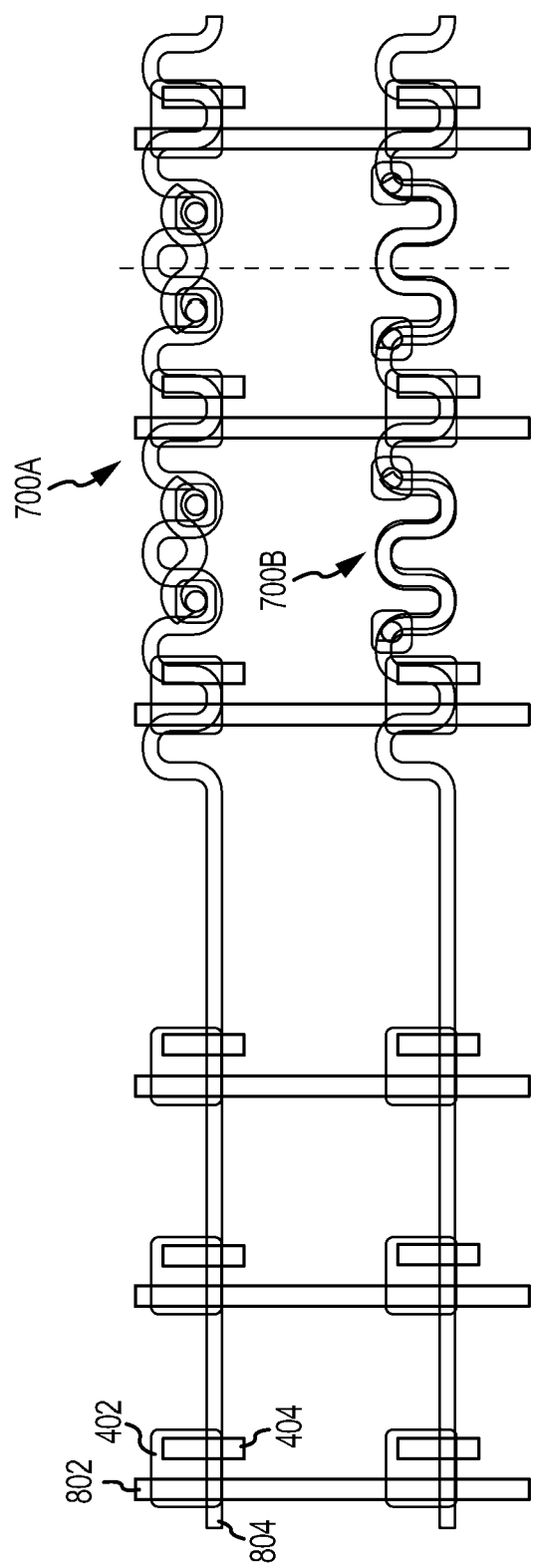
FIG. 8 depicts the gate/control lines and data lines of a sample display, along with a number of TFTs.

FIG. 8 depicts the gate/control lines and data lines of a sample display, along with a number of TFTs. Again, each TFT 402 including drain/source 404 generally corresponds to a single pixel. The gate/control lines 804 connect all TFTs in a row, while the data lines 802 connect all TFTs in a column. As with prior embodiments, the schematic view of FIG. 8 is intended to illustrate a display having both a non-bendable portion (e.g., the portion where the gate/control lines are linear) and a bendable portion (e.g., the portion where the gate/control lines are serpentine). It should be appreciated that displays may be fully bendable and have no no-bendable portions, depending on the embodiment, and still incorporate the illustrated qualities of FIG. 8 (for example, a serpentine multi-trace pattern may be used across an entirety of a display). Likewise, both data and gate/control lines may be serpentine, sine-shaped or otherwise patterned to be flexible under stress.

As illustrated in FIG. 8, both overlapping and offset redundant metal traces may be employed in the same display. FIG. 8 shows an offset pair of serpentine metal traces along the top set of gate/control lines and an overlapping pair of metal traces along the bottom gate/control lines. It should also be appreciated that this redundancy may be used only in certain portions of a display, such as those in an area or section that may be more susceptible to breaking or fracturing under stress, or in areas having sufficient space to support such redundancy.

Figure 9:
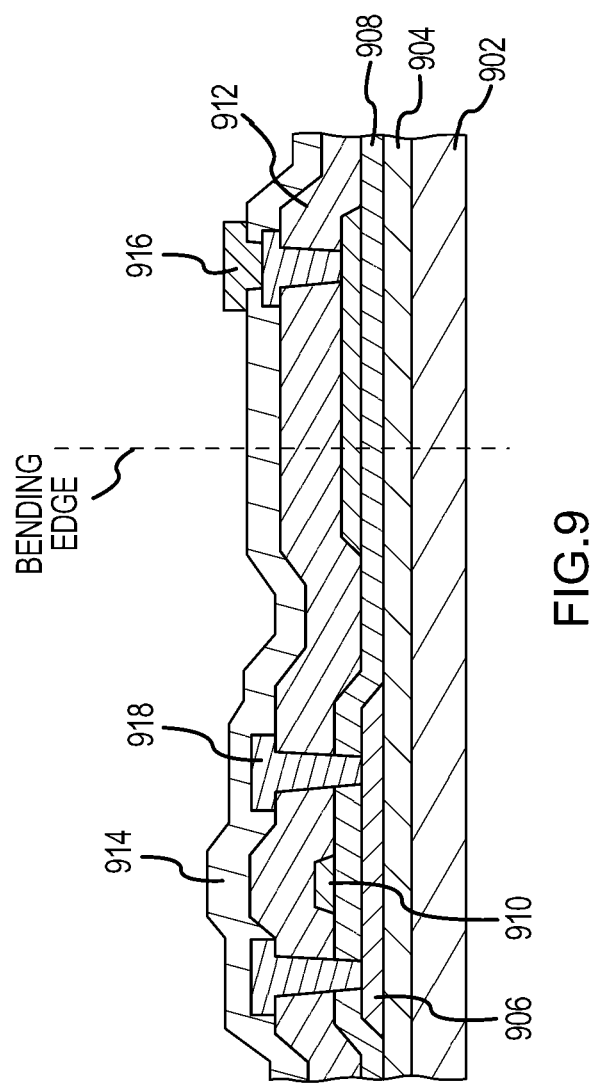
FIG. 9 generally depicts a cross-section of a portion of a display pixel's TFT and metal traces associated with the TFT.

Sample stack-ups of a flexible display will now be discussed. FIG. 9 generally depicts a cross-section of a portion of a display pixel's TFT and metal traces associated with the TFT. The cross-section is taken as shown by arrows A-A in FIG. 4. Generally, the TFT itself does not bend (although in alternative embodiments, it may). Rather, the display bends along and to the right of the line labeled "bending area" (with respect to FIG. 9). The TFT itself is generally to the left of the bending area line in FIG. 9, while the inter-TFT area, including the metal traces previously discussed, is to the right.

By way of explanation, the labels for various layers will now be discussed. Substrate 902 may be formed of polyimide (PI), which is one example of a suitable substrate on which a flexible display may be formed. Other embodiments may use different substrates. The buffer layer 904 is a base layer between the substrate (e.g., PI) and gate metal 910/gate insulators 908. The buffer layer may be formed from one or both of silicon nitride and silicon oxide. The layer 906 is the active semiconductor layer of the TFT. The semiconductor may be formed of amorphous silicon, low temperature polysilicon or metal oxide. The gate insulator (GI) layer 908 may be formed of a silicon oxide. Atop the GI layer is the gate layer, which is again a metal. An inter-layer dielectric (ILD) partially surrounds the gate 910 and is partially atop the GI layer 908. This inter-layer dielectric may be formed from one or both of silicon nitride and silicon oxide. (It should be appreciated that any silicon oxide and/or silicon nitride may be suitable in any of the layers.) Source/drain metal 918 connect to active layer 906. A passivation layer 914, denoted by "PAS," is formed above the source/drain metal 918 and may be made from a silicon nitride. The "PAD" 916 shown on FIG. 9 is the contact pad, e.g., the bonding site between the panel and/or driver integrated circuit and a flex circuit.

In some embodiments, an encapsulation layer overlies the TFT structure.

A sample simplified view of the buffer layer 904 of FIG. 9 is shown in FIG. 10. Buffer layer 904 may include a first layer 904B, which may be formed of silicon oxide and the like. Buffer layer 904 may also include a second layer 904A, which may be formed of silicon nitride and the like. In particular, the dashed line in FIGS. 10-13 is the same as the dashed line in FIG. 9, labeled "bending area." Generally, silicon oxides may bend more reliably without failing than silicon nitrides when used in the structure shown in FIG. 9, or similar structures. The second layer 904 may have some striations 907. Generally, the interval between cracks in the silicon nitride of a given layer is a function of the layer thickness. Thus, it may be useful to form a specialized pattern in the silicon nitride portion of the buffer layer to prevent cracking when the display flexes.

Different embodiments may change the deposition order of silicon nitride (e.g., SiNx) and silicon oxide (e.g., SiO) in the buffer layer 904. Accordingly, FIGS. 10-13 presume that silicon oxide is deposited first and then silicon nitride is deposited. By contrast, FIGS. 14-15 presume that silicon nitride is first deposited, followed by silicon oxide.

Continuing with FIG. 10, it may be useful to create striations in the silicon nitride of the buffer layer (or other layer) at fairly regular intervals to prevent the formation of cracks in the buffer layer. Since the crack interval may be determined as a function of the layer thickness, the layer can be striated at the same intervals at which expected crack or breaks may form. FIG. 10 depicts the buffer layer 904 with these striations formed at such intervals.

As another option, the silicon nitride may be thinned instead of striated. A thinned layer may be more likely to flex or bend than crack. Accordingly, thinning the SiNx layer 904C in the bending region to the right of the dash line, as shown in FIG. 11, may enhance performance of the display. In particular, one or more thinned areas may be formed such that a step pattern is created. The thinned areas may be larger or smaller than shown in FIG. 11. In some embodiments, the SiNx may define a thinned area, then may increase to a thicker area and then define another thinned area. Such thinned areas may be formed at expected cracking intervals.

FIGS. 12 and 13 depict one sample masking and ashing operation that may generate the buffer layer shown in FIG. 10. Initially, a half tone photoresist (labeled "PR") mask 1202 may be deposited across the entirety of the SiNx layer of the buffer layer 904. Exposure to ultraviolet light may ash the photoresist and the SiNx layer. Here, three different exposures may be used. 100% exposure to ultraviolet light may be used to ash entirely through the photoresist and silicon nitride layer to form the striations. 30% exposure to ultraviolet light may be used to remove the photoresist, but not remove any of the silicon nitride layer. Additionally, 0% exposure to ultraviolet light may keep the photoresist, which protects the active layer 906. What is left after such ashing is shown in FIG. 13. This photoresist may be deposited through an additional masking operation when forming the TFT and metal line structure.

FIGS. 14 and 15 generally depict sample buffer layers for use with a flexible display. Unlike the buffer layers shown in FIGS. 10 and 11, in these layers silicon oxide overlays silicon nitride. Again, the silicon oxide and silicon nitride of the buffer may be formed on a polyimide substrate.

FIG. 14 is similar to FIG. 10, in that striations may be formed in the silicon nitride 1402B of the buffer layer 904 at the expected crack intervals. Here, however, the silicon oxide 1402A may partially or completely fill in such striations. An extra mask may be needed to form the silicon nitride layer when compared to masking operations that lack the aforementioned striations or trenches.

FIG. 15, by contrast, is similar to FIG. 11. Again, the silicon nitride 1502B has been thinned to form an area that may bend or flex without cracking. Again, the silicon oxide may overlay this thinned area. Although FIG. 15 shows the silicon oxide layer 1502A as having an approximately even thickness along the entire layer, in some embodiments the silicon oxide may be thicker where it overlies the thinned silicon nitride. In this manner, the buffer layer may have a uniform, smooth upper surface. Since the silicon oxide is less prone to cracking during a bending or flexing operation, it may be thickened as necessary in certain embodiments.

Figure 16:
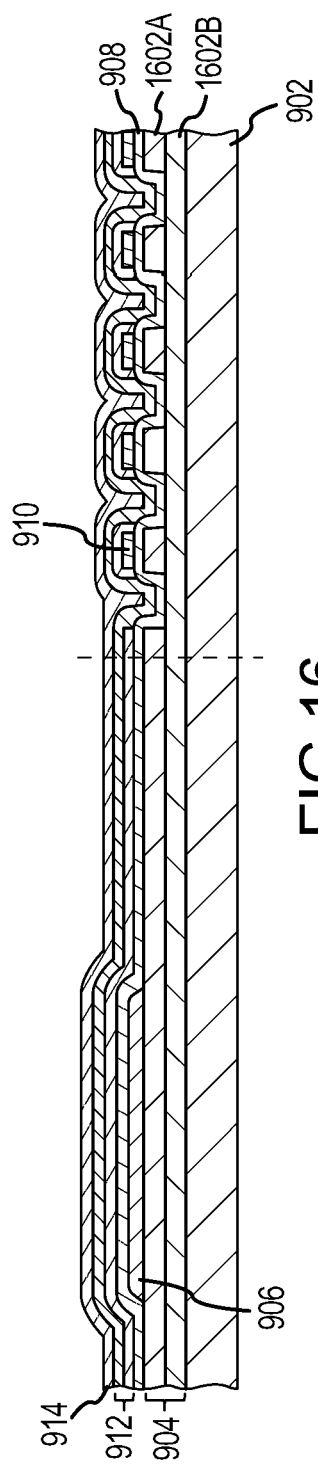
FIG. 16 depicts an ILD suitable for use in a flexible display, in which striations are formed in the silicon nitride portion of the ILD.
Figure 17:
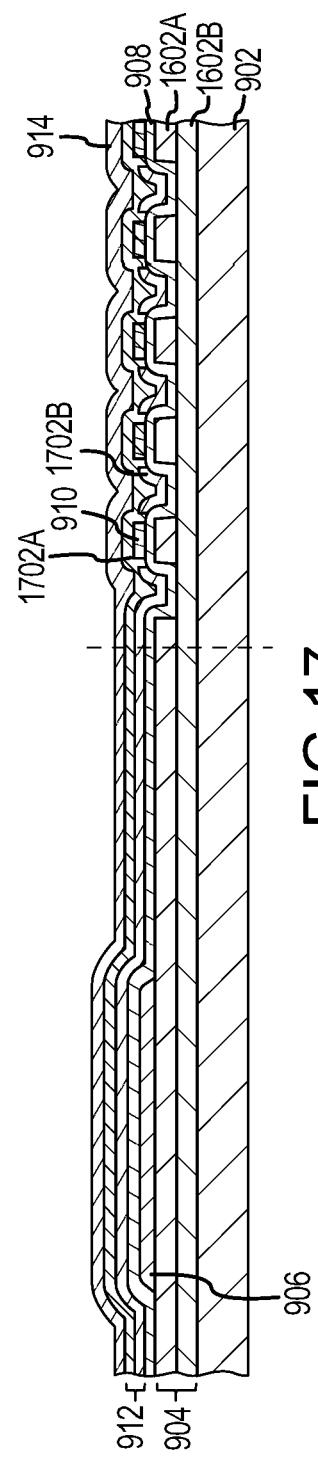
FIG. 17 is an alternative of an ILD, in which the silicon nitride is removed from above the gate metal fanout but preserved in the intra-gate metal regions.
Figure 18:
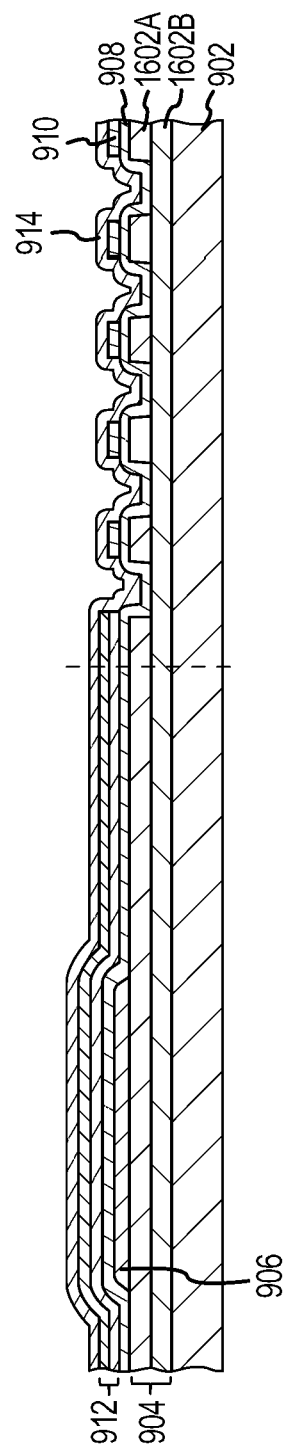
FIG. 18 is yet another embodiment of an ILD suitable for use in a flexible display.

FIGS. 16-18 will now be discussed. These figures show various embodiments of the inter-layer dielectric (ILD) layer shown generally in FIG. 9. The cross section is taken as shown by arrows B-B in FIG. 4. As can be seen from the figures, the ILD 912 generally lies between the buffer 904 and/or gate insulator layers 908 and the passivation layer 914. The active element 906 shown in the figures is a portion of the source/drain metal shown in FIG. 9. Note that the gate metal is between gate insulator 908 and the ILD 912, which is not shown above the active layer 906 in FIGS. 16-18. Also, the source/drain metal is between the ILD 912 and passivation layer 914, which is not shown above the active layer 906 in FIGS. 16-18.

The ILD layer 1602 is generally formed from a sublayer of silicon oxide 1602A and a sublayer of silicon nitride 1602B. Thus, the silicon nitride portion of the ILD may also be susceptible to cracking during flexing of the display. Accordingly, and as shown in FIG. 16, striations may be formed in the silicon nitride portion of the ILD. Silicon nitride nonetheless generally overlays the fanout portions of the gate metal, as also shown in FIG. 16. Further, the silicon oxide may at least partially fill in the striations in the silicon nitride, as may the passivation layer above the ILD 1602.

FIG. 17 is an alternative embodiment to the embodiment of FIG. 16. Here, the silicon nitride 1602B of the ILD 1602 is removed from above the gate metal fanout but preserved in the intra-gate metal regions.

FIG. 18 is yet another embodiment of an ILD suitable for use in a flexible display. In this embodiment, the ILD 1702 is completely removed from the bending area of the display. That is, the silicon oxide 1702A and silicon nitride 1702B layers of the ILD do not cover the gate metal fanout area at all.

FIGS. 19A-C show sample patterns of the serpentine portion 104 of FIG. 1 as alternative embodiments. As shown in FIG. 19A, the stretchable metal trace may have a serpentine pattern. In a particular embodiment, the trace width "w" as shown in FIG. 19A may be about 4 µm while the radius "r" as shown in FIG. 19A may be about 5 µm. The trace width may also increase to about 8 µm while the radius "r" may increase to about 6 µm. It should be appreciated that there are sample dimensions for one embodiment; the dimensions may vary from embodiment to embodiment and so should be considered examples and not limitations or requirements.

As shown in FIG. 19B, the stretchable metal trace may have a sine wave pattern. In a particular embodiment, the trace width "w" as shown in FIG. 19B may be about 4 µm while the radius "r" shown in FIG. 19B may be about 8 µm. The trace width may also increase to about 8 µm while the radius may increase to about 20 µm.

As shown in FIG. 19C, the stretchable metal trace may have a square pattern. The trace width "w" and the radius "r" are defined as shown in FIG. 19C. The trace width and the radius may be similar to the sine wave pattern. It will be appreciated by those skilled in the art that the pattern may vary, as long as the pattern allows the metal trace to be stretchable.

FIGS. 19D-F show sample patterns of the redundancy design 700A of FIG. 7 as alternative embodiments. As shown, two metal traces are interleaved with a first overlapping region and a second overlapping region 1904 between a first metal trace 1906 and a second metal trace 1908. The first and second overlapping regions 1902 and 1904 are shown within dashed lines. First metal trace 1906 is formed from a first metal layer which is the same as the gate line or gate electrode. Second metal trace 1908 is formed from a second metal layer which is the same as the data line and source/drain electrodes. The trace width and the radius may be larger than the single metal trace patterns without redundancy as shown in FIGS. 19A-C.

Example dimensions are provided below. The definitions of the trace width and the trace radius remain the same as the corresponding single metal trace. In case of the redundancy serpentine pattern as shown in FIG. 19D, the trace width may be 4 µm and the radius may be 10 µm. If the trace width is 8 µm and the radius may be 15 µm. Again, these are sample dimension that may vary in different embodiments, as is true for all dimensions, tolerances, measurements and the like throughout this document.

In the case of the redundancy sine wave pattern as shown in FIG. 19E, the trace width may be 4 µm and the radius may be 15 µm. If the trace width is 8 µm and the radius may be 30 µm. Again, the redundancy square pattern may have similar trace width and radius to the redundancy sine wave pattern.

FIGS. 19G-H show the cross-sectional view of the first and second overlapping regions between two metal traces in accordance with embodiment of the present disclosure. The first overlapping region 1902 may connect to a straight line portion of either a data line or a gate line (such as overlapping region 706 as shown in FIG. 7). As shown in FIG. 19G, the first metal or gate is connected to the second metal or source/drain electrodes through a conductive layer 1910 by a through hole (VIA) 1912 defined in the passivation layer and gate insulator. The conductive layer 1910 may be formed of a transparent conductor, such as indium-tin-oxide. The conductive layer is also disposed over a passivation layer 914 which is on top of the second metal trace 1908. The first metal is coupled to gate line 304, while the second metal is coupled to data line 302.

Alternatively, the conductive layer 1910 (not shown) may be eliminated. The second metal trace may be on top of the first metal trace in a through hole such that the two metal traces are connected to have redundant metal traces. In case one metal trace is broken, the other metal trace is still connected.

Referring to FIG. 19H now, the first metal trace 1906 and the second metal trace 1908 does not connect to each other in the second overlapping region 1904. They are separated by an ILD 912.

Figure 20A:
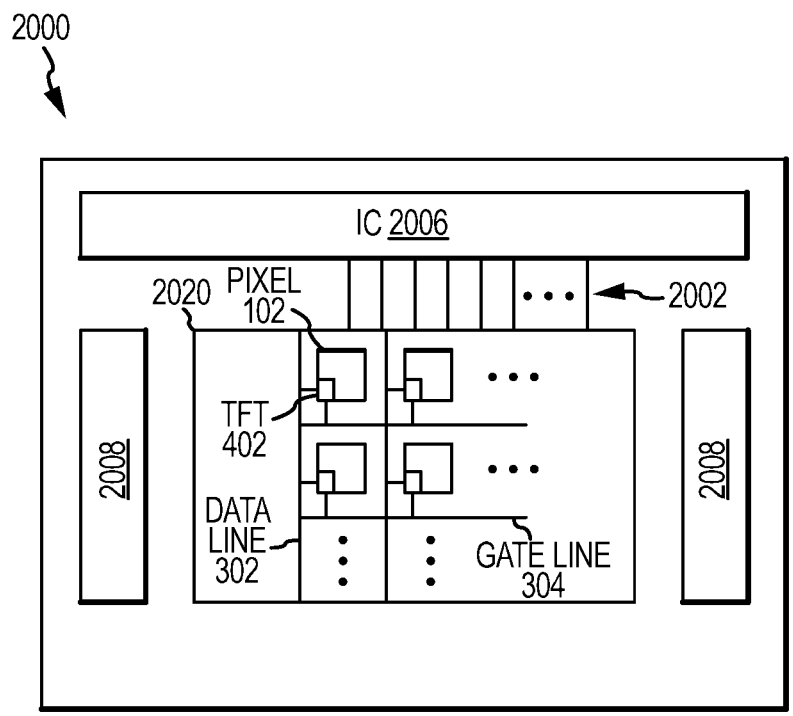
FIG. 20A illustrates a top view of a flexible display in accordance with embodiments of the present disclosure.

FIG. 20A shows a top view of a flexible display in accordance with embodiments of the present disclosure. As shown, a flexible display 2000 includes a display region 2020 that includes pixel regions 102 and TFTs, gate lines 304 and data lines 302. Additionally, the flexible display includes integrated gate drivers 2008 on the left and right sides of the display region and an integrated circuit (IC) 2006 on the top of the display region. The integrated gate drivers may be fabricated at the same time as the active layer 906. The integrated drivers 2008 and the IC 2006 are outside the display region 2020. The flexible display further includes metal traces 2002 coupled between IC 2006 and display region 2020.

Figure 20B:
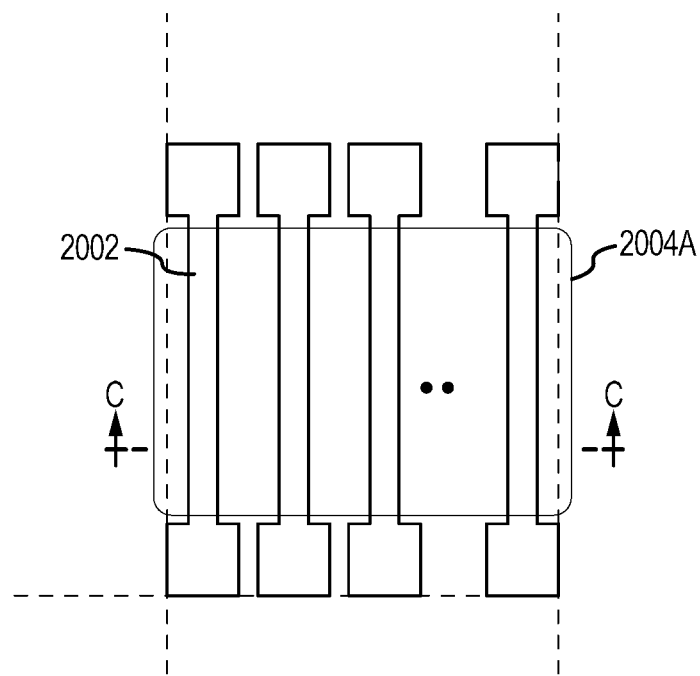
FIG. 20B illustrates a top view of the area including uniform buffer or interlayer dielectric (ILD) overlapping metal traces coupled between integrated circuit (IC) board and TFTs in accordance with first embodiment of the present disclosure.
Figure 20C:
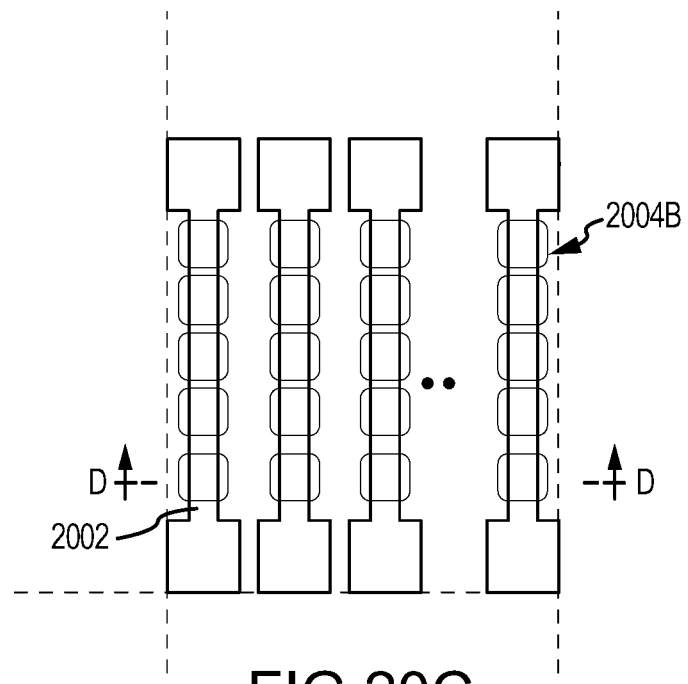
FIG. 20C illustrates a top view of the area including striated buffer or ILD pattern overlapping metal traces coupled between integrated circuit (IC) board and TFTs in accordance with second embodiment of the present disclosure.
Figure 20D:
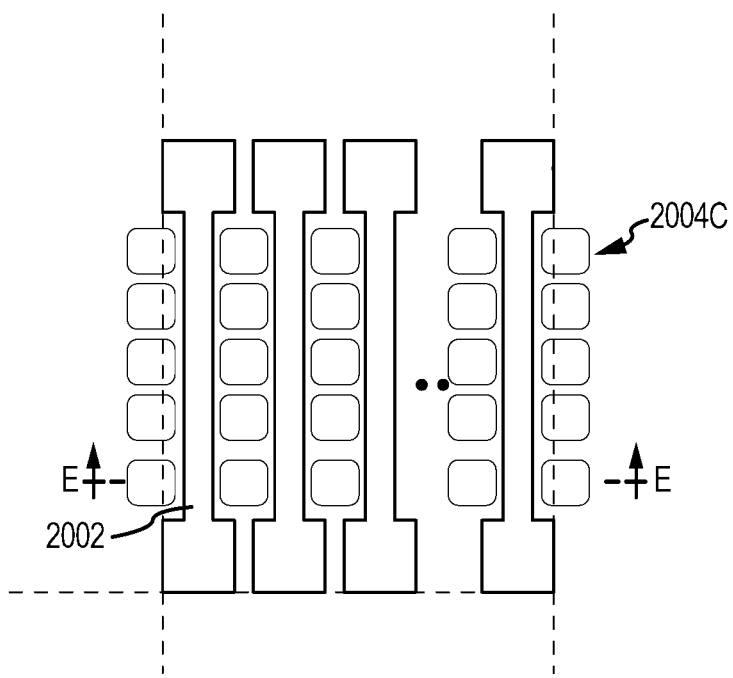
FIG. 20D illustrates a top view of the area including striated buffer or ILD pattern offsetting from metal traces coupled between integrated circuit (IC) board and TFTs in accordance with third embodiment of the present disclosure.

FIGS. 20B-20D show top views of a silicon nitride sublayer overlapping with metal traces in according to embodiments of the present disclosure. The silicon nitride sublayer may be included in either the buffer layer or the ILD. The metal traces 2002 are coupled between IC 2006 and display region 2020 as shown in FIG. 20A. FIG. 20B shows that the silicon nitride sublayer 2004A is uniformly cross the metal traces 2002. FIG. 20C shows that the silicon nitride has a striated pattern 2004B, and the striated pattern 2004B overlaps with the metal traces 2002. FIG. 20D shows that the silicon nitride sublayer may also have a striated pattern 2004C, which may shift from overlapping the metal traces 2002 to filling the space between the metal traces 2002.

FIGS. 21A-D illustrate sample cross-sectional views of the display in accordance with embodiments of the present disclosure. FIG. 21A shows a cross-sectional view with the silicon nitride sublayer 904A and 912A in a uniform pattern for the buffer layer 904 and the ILD layer 912 as shown in FIG. 20B. As shown, the silicon nitride sublayers in both the buffer layer and the ILD do not have any striated pattern, as the top view FIG. 20B shows. It will be appreciated by those skilled in the art that the silicon nitride sublayer 904A in the buffer layer 904 may be exchanged position with silicon oxide sublayer 904B. Namely, the silicon oxide sublayer 904B may be on top of the silicon nitride sublayer 904A. Likewise, the silicon nitride sublayer 912A in the ILD layer 912 may be exchanged position with silicon oxide sublayer 912B.

FIG. 21B shows a cross-sectional view of the display in accordance with embodiments of the present disclosure. As shown, the silicon nitride sublayer 2014B of the buffer layer 904 has a striated pattern as shown in FIG. 20C. The silicon oxide sublayer 2014B is uniform in some embodiments. The striated pattern 2014B overlaps with the metal trace 2002 of the first metal (e.g. gate metal). In this embodiment, the ILD 912 as shown in FIG. 21A is eliminated in this region beyond the TFTs 402 or display region 2020. Again, it will be appreciated that the silicon nitride sublayer 2014B may be exchanged position with the silicon oxide sublayer 2014A. It will also be appreciated that the display may include an ILD layer that includes a uniform silicon nitride sublayer like in FIG. 21B in an alternative embodiment. The ILD may also include a striated pattern like the silicon nitride sublayer 2014B in the buffer layer in another embodiment.

FIG. 21C a cross-sectional view of the display in accordance with embodiments of the present disclosure. As shown, the silicon nitride sublayer of the ILD layer 912 has a striated pattern as shown in FIG. 20D. The striated silicon nitride pattern 2012B of the ILD layer fills the space between the metal traces 2002. However, the silicon nitride sublayer 2014B with a striated pattern, as shown in FIG. 20C, typically still overlaps with the metal trace 2002 of the first metal (e.g. gate metal).

FIG. 21D a cross-sectional view of the display in accordance with embodiments of the present disclosure. As shown, the ILD layer includes a striated silicon nitride sublayer 2012C with a striated pattern 2004B as shown in FIG. 20C. The striated silicon nitride sublayer 2012C overlaps with metal trace 2002, while the striated silicon nitride sublayer 2014B is offset from the metal trace 2002 and between two metal traces 2002. The silicon oxide sublayer 2014A in the buffer layer 904 and the silicon oxide sublayer 2012A in the ILD layer 912 are uniform with a uniform pattern 2004A as shown in FIG. 20A.

It will be appreciated by those skilled in the art that the metal traces 2002 may be formed of redundant metal traces, such as two metal traces overlapping or interleaved shown in FIG. 7 and FIGS. 19A-F with different shapes, such as serpentine, sine wave, square wave and the like. The metal traces 2002 may be formed of at least one of the gate metal or drain/source metal or both the gate metal and the drain/source metal. It will be appreciated by those skilled in the art that a combination of the silicon nitride sublayers in the buffer layer and the ILD layer and the metal traces may vary to be resistant to cracking or disconnections subjected to stretching or bending resulted stress or strain.

Although embodiments have been discussed with respect to particular structures and manufacturing processes, it will be apparent to those of skill in the art that variations may be made to such embodiments upon reading the disclosure. Such variations and changes are fully embraced by this document.

What is claimed is:

1. A flexible display having an array of pixels in an active area of the display that emits light to display images to a user, the flexible display comprising:
    a flexible substrate;
    an array of thin film transistors corresponding to the array of pixels on the flexible substrate;
    a first plurality of metal lines coupled to gate electrodes of the thin film transistors; and
    a second plurality of metal lines coupled to source-drain electrodes of the thin film transistors, wherein a line in the first plurality of metal lines comprises a stretchable portion that overlaps a first line in the second plurality of metal lines and comprises a straight portion that overlaps a second line in the second plurality of metal lines, wherein an area of overlap between the stretchable portion and the first line and an area of overlap between the straight portion and the second line are the same, and wherein the stretchable portion of the line overlaps the active area of the display that emits the light to display the images to the user.

2. The flexible display of claim 1, wherein the stretchable portion is shaped in a pattern configured to be bendable.

3. The flexible display of claim 2, wherein the pattern comprises at least one pattern selected from the group consisting of a serpentine pattern, a sine wave pattern, and a square wave pattern.

4. The flexible display of claim 1, wherein the pixels comprise organic light emitting diodes.

5. The flexible display of claim 1, further comprising a buffer layer between the substrate and the thin film transistors.

6. The flexible display of claim 5, further comprising an active semiconductor layer over the buffer layer and a gate insulator over the active semiconductor layer, wherein the gate electrodes are disposed over the gate insulator.

7. The flexible display of claim 6, wherein the active semiconductor layer comprises a material selected from the group consisting of amorphous silicon, low temperature polysilicon, and metal oxide.

8. The flexible display of claim 5, wherein the buffer layer comprises a sublayer of silicon oxide and a sublayer of silicon nitride, wherein the silicon nitride comprises striations between the thin film transistors in the array of thin film transistors.

9. The flexible display of claim 5, wherein the buffer layer comprises a sublayer of silicon oxide and a sublayer of silicon nitride, wherein the silicon nitride comprises a first portion formed beneath at least one thin film transistor in the array of thin film transistors and a second portion that is not formed beneath the at least one thin film transistor, wherein the first portion is thicker than the second portion.

10. The flexible display of claim 1, further comprising an interlayer dielectric between the gate electrodes of the thin film transistors and the source-drain electrodes of the thin film transistors.

11. The flexible display of claim 10, wherein the interlayer dielectric comprises a sublayer of silicon oxide and a sublayer of silicon nitride, and wherein the silicon nitride comprises a striation pattern between the thin film transistors in the array of thin film transistors.

12. The flexible display of claim 10, wherein the interlayer dielectric overlaps at least some of the thin film transistors in the array of thin film transistors and is absent between at least some of the thin film transistors in the array of thin film transistors.

13. The flexible display of claim 1, further comprising a passivation layer disposed over the source-drain electrodes of the thin film transistors.

14. The flexible display of claim 13, wherein the passivation layer comprises a flexible organic material.

15. The flexible display of claim 1, wherein the flexible substrate comprises polyimide.

16. The flexible display of claim 1, wherein the stretchable portion is formed from first and second overlapping metal traces, and wherein the first metal trace is electrically shorted to the second metal trace.

17. The flexible display of claim 16, wherein the first metal trace comprises a first stretchable portion that is formed from a first metal layer that forms the gate electrodes, and wherein the second metal trace comprises a second stretchable portion that is formed from a second metal layer that forms the source-drain electrodes.

18. The flexible display of claim 17, wherein the first stretchable portion is electrically shorted to the second stretchable portion in at least one location between the thin film transistors in the array of thin film transistors.

19. A flexible display having an array of pixels, the flexible display comprising:
a flexible substrate;
a buffer layer over the flexible substrate;
an array of thin film transistors corresponding to the array of pixels on the flexible substrate;
a first plurality of metal lines coupled to gate electrodes of the thin-film transistors;
a second plurality of metal lines coupled to source-drain electrodes of the thin-film transistors;
an integrated circuit that is outside the array of thin-film transistors and the array of pixels; and
a plurality of metal traces coupled between the thin-film transistors and the integrated circuit, the plurality of metal traces being formed of at least one of a first metal layer that forms the gate electrodes of the thin-film transistors and a second metal layer that forms the source-drain electrodes of the thin-film transistors, wherein the plurality of metal traces is disposed over the buffer layer; and
a gate insulator layer interposed between the first metal layer and the buffer layer, wherein the buffer layer comprises first and second sublayers, wherein the first sublayer comprises a plurality of gaps and is interposed between the second sublayer and the flexible substrate, and wherein the second sublayer is formed in the gaps to form striations in the buffer layer.

20. The flexible display of claim 19, wherein the plurality of metal traces are configured to be stretchable.

21. The flexible display of claim 19, wherein at least one of the first plurality of metal lines and the second plurality of metal lines comprises a non-stretchable portion that at least partially overlaps a thin-film transistor in the array of thin-film transistors and a stretchable portion that does not overlap the thin-film transistor in the array of thin-film transistors.

22. The flexible display of claim 21, wherein the stretchable portion comprises a metal trace shaped in a pattern configured to be bendable.

23. The flexible display of claim 22, wherein the pattern comprises at least one pattern selected from the group consisting of a serpentine pattern, a sine wave pattern, and a square wave pattern.

24. The flexible display of claim 19, wherein the pixels comprise organic light emitting diodes.

25. The flexible display of claim 19, wherein the second sublayer comprises silicon oxide and the first sublayer comprises silicon nitride, and wherein the striations are formed between the array of pixels and the integrated circuit.

26. The flexible display of claim 19, wherein the second sublayer comprises silicon oxide and the first sublayer comprises silicon nitride, wherein the silicon nitride comprises a first portion formed beneath at least one thin-film transistor in the array of thin-film transistors and a second portion that is not formed beneath the at least one thin-film transistor, and wherein the first portion is thicker than the second portion.

27. The flexible display of claim 19, further comprising an interlayer dielectric between the gate electrodes of the thin-film transistors and the source-drain electrodes of the thin-film transistors.

28. The flexible display of claim 27, wherein the interlayer dielectric comprises a sublayer of silicon oxide and a sublayer of silicon nitride, and wherein the silicon nitride comprises a striation pattern between the array of pixels and the integrated circuit.

29. The flexible display of claim 27, wherein the interlayer dielectric layer overlaps the thin-film transistors in the array of thin-film transistors and is absent between the array of thin-film transistors and the integrated circuit.

30. The flexible display of claim 19, further comprising a passivation layer disposed over the source-drain electrodes of the thin-film transistors.

31. The flexible display of claim 30, wherein the passivation layer comprises a flexible organic material.

32. The flexible display of claim 19, wherein the flexible substrate comprises polyimide.

33. The flexible display of claim 21, wherein the stretchable portion of the at least one of the first plurality of metal lines is formed from first and second overlapping metal traces, wherein the first metal trace is electrically shorted to the second metal trace.

34. The flexible display of claim 33, wherein the first metal trace comprises a first stretchable portion that is formed from a first metal layer that forms the gate electrodes, and wherein the second metal trace comprises a second stretchable portion that is formed from a second metal layer that forms the source-drain electrodes.

35. The flexible display of claim 33, wherein the first stretchable portion is electrically shorted to the second stretchable portion in at least one location between the thin-film transistors in the array of thin-film transistors.

36. The flexible display of claim 19, wherein the first sublayer is in direct contact with the second sublayer.

\* \* \* \* \*